US012100675B2

(12) United States Patent
Cho

(10) Patent No.: US 12,100,675 B2
(45) Date of Patent: Sep. 24, 2024

(54) TRANSMISSION LINE STRUCTURES FOR THREE-DIMENSIONAL INTEGRATED CIRCUIT AND THE METHODS THEREOF

(71) Applicant: Taiwan Semiconductor Manufacturing Company, Ltd., Hsin-Chu (TW)

(72) Inventor: Hsiu-Ying Cho, Hsin-Chu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 239 days.

(21) Appl. No.: 17/751,116

(22) Filed: May 23, 2022

(65) Prior Publication Data

US 2023/0050993 A1  Feb. 16, 2023

Related U.S. Application Data

(60) Provisional application No. 63/232,779, filed on Aug. 13, 2021, provisional application No. 63/232,954, filed on Aug. 13, 2021.

(51) Int. Cl.
*H01L 23/66* (2006.01)
*H01L 21/768* (2006.01)
(Continued)

(52) U.S. Cl.
CPC ........ *H01L 23/66* (2013.01); *H01L 21/76837* (2013.01); *H01L 23/5283* (2013.01);
(Continued)

(58) Field of Classification Search
CPC .......... H01P 3/003; H01P 3/081; H01P 3/082; H01P 3/085; H01L 23/66;
(Continued)

(56) References Cited

U.S. PATENT DOCUMENTS 10,658,281 B2 * 5/2020 Manepalli ......... H01L 23/49822

OTHER PUBLICATIONS

Hsiu-Ying Cho et al., "High-Performance Slow-Wave Transmission Lines with Optimized Slot-Type Floating Shields", IEEE Transactions on Electron Devices (vol. 56, Issue: 8, Aug. 2009), pp. 1705-1711.
(Continued)

*Primary Examiner* — Thanhha S Pham
(74) *Attorney, Agent, or Firm* — HAYNES AND BOONE, LLP

(57) ABSTRACT

An exemplary device includes a dielectric layer and a transmission line structure disposed in the dielectric layer. The transmission line structure includes a first metal line disposed between a second metal line and a third metal line. Dielectric islands are disposed in a first region and a second region of the dielectric layer. The first region of the dielectric layer is between the first metal line and the second metal line. The second region of the dielectric layer is between the first metal line and the third metal line. A dielectric constant of the dielectric islands is greater than a dielectric constant of the dielectric layer. The dielectric islands may be doped sections of the dielectric layer. In some embodiments, the dielectric islands in the first region are aligned with the dielectric islands in the second region along a direction perpendicular to a lengthwise direction of the first metal line.

20 Claims, 27 Drawing Sheets

(51) Int. Cl.
*H01L 23/528* (2006.01)
*H01L 27/06* (2006.01)
*H01P 3/00* (2006.01)
*H01P 3/08* (2006.01)

(52) U.S. Cl.
CPC .......... *H01L 23/5286* (2013.01); *H01P 3/003* (2013.01); *H01P 3/082* (2013.01); *H01L 27/0688* (2013.01); *H01L 2223/6627* (2013.01)

(58) Field of Classification Search
CPC ........... H01L 21/76837; H01L 23/5283; H01L 23/5286; H01L 2223/6627; H01L 23/5225; H01L 23/53295; H01L 23/5222
See application file for complete search history.

(56) References Cited

OTHER PUBLICATIONS

Hsiu-Ying Cho et al. "A Novel Transmission-Line Deembedding Technique, for RF Device Characterization", Published in: IEEE Transactions on Electron Devices (vol. 56, Issue: 12, Dec. 2009), pp. 3160-3167.

\* cited by examiner

TRANSMISSION LINE STRUCTURES FOR THREE-DIMENSIONAL INTEGRATED CIRCUIT AND THE METHODS THEREOF

This application claims priority to U.S. Provisional Patent Application Ser. No. 63/232,779, filed on Aug. 13, 2021, and U.S. Provisional Patent Application Ser. No. 63/232,954 filed on Aug. 13, 2021, the entire disclosures of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs and, for these advances to be realized, similar developments in IC processing and manufacturing are needed. For example, as multilayer interconnect (MLI) structures become more compact with ever-shrinking IC feature size, transmission line structures of the MLI structures need to scale down accordingly to accommodate the improvements of such IC devices in the advanced technology nodes. Although existing transmission line structures have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
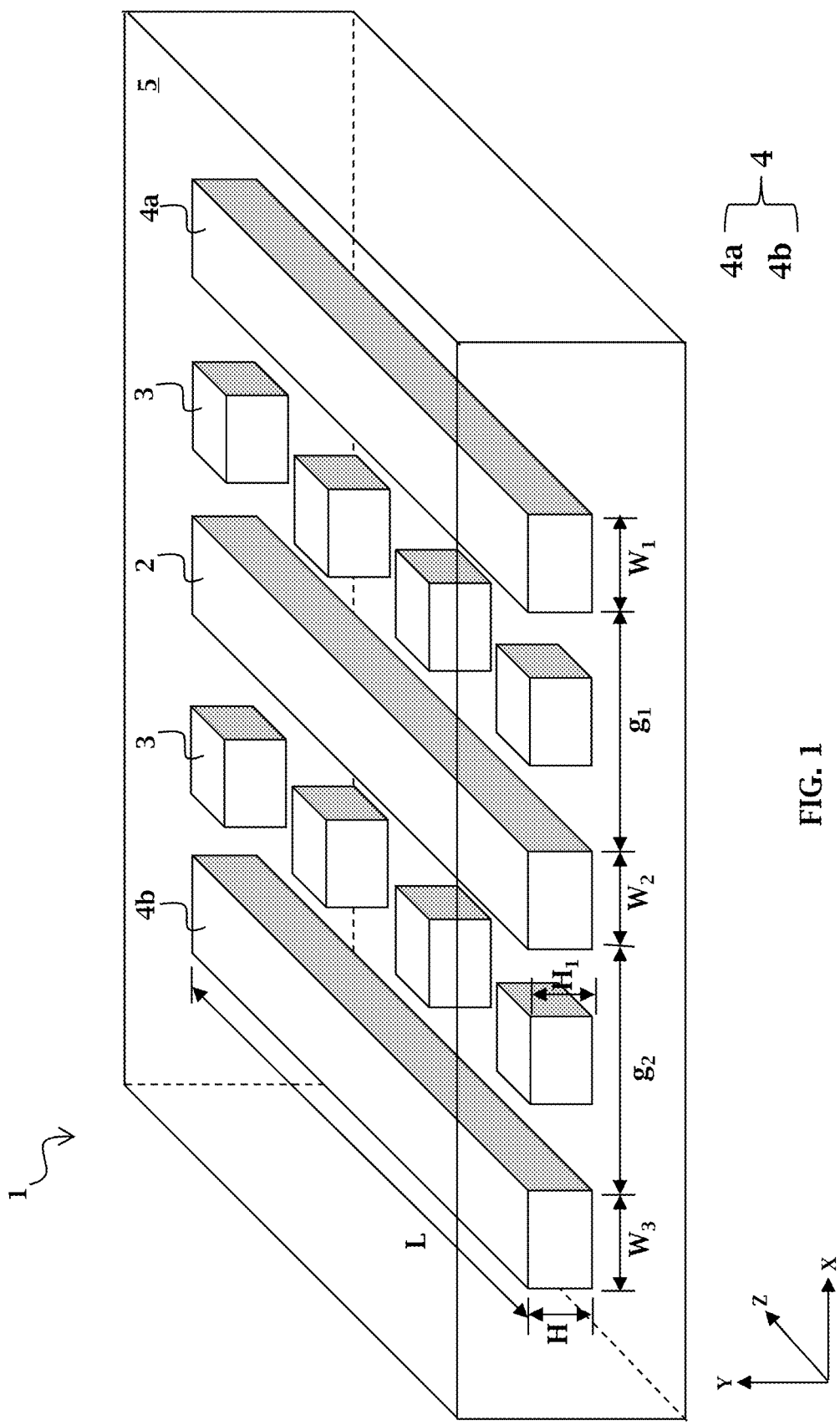
FIG. 1 illustrates a perspective view of an embodiment of a transmission line structure, according to various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure is generally directed to transmission line structures for three-dimensional integrated circuits (3D ICs), in particular, transmission line structures that can be implemented in small form factor 3D IC packages.

Transmission line structures are implemented in the MLI structures of the ICs for transmitting signals, such as radio frequency (RF) signals. A transmission line structure includes conductive lines disposed in a dielectric layer, where the signals are transmitted by (or travel through) one or more of the conductive lines. The length of the transmission line structure is designed according to the wavelength $\lambda$ of the signals traveling through the transmission line structure, such as half-wavelength or quarter-wavelength. In order to reduce the length of the transmission line structure to fit for small form factor 3D IC packages, the wavelength $\lambda$ of the signals traveling through the conductive lines need to be reduced. The present disclosure proposes to reduce the wavelength $\lambda$ of the signals by incorporating dielectric regulating structures in the dielectric layer to increase the dielectric constant, thereby reducing the lengths of signal wavelength $\lambda$. For example, an electromagnetic wavelength $\lambda$ in an $SiO_2$ dielectric material may be about 3000 µm at 50 GHz, which requires a length of 750 µm for the quarter-wavelength-long transmission line structures. To reduce the length of the transmission line structures, dielectric regulating structures can be formed in the $SiO_2$ dielectric material to reduce its wavelength $\lambda$ to, for example, 2000 µm. As a result, the length of the quarter-wavelength-long transmission line structures can be reduced to 500 µm.

FIG. 1 illustrates a perspective view of an embodiment of a transmission line structure 1. The transmission line structure 1 comprises one or more conductive lines 2, 4a and 4b embedded in a dielectric layer 5. The dielectric layer 5 may include any suitable material. In the present embodiment, the dielectric layer 5 includes tetraethyl orthosilicate (TEOS) oxide, silicon oxide, silicon nitride, silicon oxynitride, hafnium oxide, zirconium oxide, titanium oxide, aluminum oxide, hafnium dioxide-alumina (HfO$_2$—Al$_2$O$_3$) alloy, phosphosilicate glass (PSG), borophosphosilicate glass (BPSG), other suitable dielectric materials, or combinations thereof.

In the present embodiments, the conductive line 2 is a signal line. The signal line 2 lies between the one or more conductive lines 4a and 4b. The one or more conductive lines 4a and 4b are relatively static lines (collectively referred to as relatively static lines 4). The signal line 2 may be coupled to a signal source. The signal source may be any suitable frequency. For example, the signal source may include a radio frequency signal source and/or consumer, such as a transmitter, a transceiver, or an antenna. In some embodiments, the signal line 2 carries a radio frequency signal along its length. In some embodiments, the signal line may be designed to carry a radio frequency signal in the microwave and/or millimeter range (for example, frequencies of about 300 MHz to about 300 GHz). In the present embodiment, the relatively static lines 4 may be electrically coupled to ground, and thus, the relatively static lines 4 may also be referred to as ground lines. In some embodiments, one or more of the relatively static lines 4 may be coupled to an AC or DC voltage source, including a reference voltage source.

The signal line 2 is composed of any material capable of propagating a radio frequency signal. The ground lines 4 are composed of any material capable of shielding. For example, the signal line 2 and/or ground lines 4 may comprise metal, such as aluminum, copper, tungsten, titanium, tantulum, titanium nitride, tantalum nitride, nickel silicide, cobalt silicide, silver, TaC, TaSiN, TaCN, TiAl, TiAlN, metal alloys, other suitable materials, and/or combinations thereof. It is understood that the signal line 2 may comprise the same or different material as the ground lines 4, and the ground line 4a may comprise the same or different material as the ground line 4b.

Signal line 2 and ground lines 4 are oriented substantially parallel to one another in a longitudinal direction. The signal line 2 and ground lines 4 may be substantially rectangular and/or substantially linear. In the present embodiments, signal line 2 and ground lines 4 extend longitudinally a substantially uniform distance L, and signal line 2 and ground lines 4 have a substantially uniform height H. In some embodiments, signal line 2 and ground lines 4 may extend longitudinally varying distances L, and signal line 2 and ground lines 4 may have varying heights H. The signal line 2, the ground lines 4a and 4b have widths $W_2$, $W_1$, and $W_3$, respectively. The width $W_1$, $W_2$, and $W_3$ may be the same as or different from one another. A gap $g_1$ between the signal line 2 and the ground line 4a may be the same as or different from a gap $g_2$ between the signal line 2 and the ground line 4b. In the present embodiments, the width $W_1$, the width $W_2$ and the width $W_3$ are equal to one another, and the gap $g_1$ equals the gap $g_2$.

The wavelength λ of the signal traveling through the signal line 2 is intrinsically related to the relative permittivity $\varepsilon_r$ of the dielectric layer 5, since both the wavelength λ and the relative permittivity $\varepsilon_r$ are related to the phase velocity $V_p$ by an equation (1):

$$V_p = f\lambda = \frac{c}{\sqrt{\varepsilon_r \mu_r}} \quad (1)$$

where f is the frequency of the signal, c is the speed of light, $\varepsilon_r$ is the relative permittivity, and $\mu_r$ is the relative permeability. Thus, the increasing of the relative permittivity $\varepsilon_r$ of the dielectric layer 5 can reduce the wavelength λ of the signal traveling along the signal line 2, thereby reducing the length of the conductive lines 2, 4a, and 4b (e.g., half-wavelength transmission line or quarter-wavelength transmission line).

In the present embodiment, dielectric regulating structures 3 are formed in the dielectric layer 5 to regulate (or tune) the relative permittivity $\varepsilon_r$ (also known and hereafter referred to as the dielectric constant κ) of the transmission line structure 1 in order to regulate the wavelength λ of the signal. The dielectric regulating structures 3 are also referred to as dielectric islands, dielectric bars, dielectric strips, dielectric rings according to the shapes of the dielectric regulating structures 3. In some embodiments, the dielectric regulating structures 3 include a high-k dielectric material, which may include metal oxides, metal nitrides, metal silicates, transition metal-oxides, transition metal-nitrides, transition metal-silicates, oxynitrides of metals, metal aluminates, zirconium silicate, zirconium aluminate, HfO2, HfSiO, HfSiON, HfTaO, HfTaTiO, HfTiO, HfZrO, HfAlON, other suitable high-k dielectric materials, or combinations thereof. In some alternative embodiments, the dielectric regulating structures 3 are doped regions of the dielectric layer 5. The dopants include fluorine, carbon, other suitable dopants, or combinations thereof. In some embodiments, the dielectric layer 5 is free from the dopants included in the dielectric regulating structures 3. In some embodiments, the dielectric layer 5 includes the same dopants as the dopants included in the dielectric regulating structures 3, in which case the concentrations of the same dopants in the dielectric regulating structures 3 are greater than the dopant concentrations in the dielectric layer 5.

The dielectric regulating structures 3 may comprise any suitable shape, such as a rectangular shape, a circular shape, an elliptical shape, a triangular shape, other suitable shape, and/or combinations thereof. In some embodiments, the dielectric regulating structures 3 comprise cubes, cuboids, quadrilateral frusta, rectangular prisms, elliptic cylinders, circular cylinders, or combinations thereof. Further, the dielectric regulating structures 3 may be substantially uniform in form and dimension, or the dielectric regulating structures 3 may vary in form, dimension, or both. The dielectric regulating structures 3 may have a uniform composition or a varied composition.

Particularly, the dielectric regulating structures 3 may have uniform dimensions or different dimensions. For example, a height $H_1$ of the dielectric regulating structure 3 may vary or may be the same. The height $H_1$ may be the same as or different from the height H. The dielectric regulating structures 3 may have a uniform dielectric constant κ or varies dielectric constants κ. In the present embodiments, the dielectric regulating structures 3 have a dielectric constant κ that is greater than 7. In some examples, the differences in the dielectric constant κ of the dielectric regulating structures 3 are realized by selecting materials of various dielectric constant κ. In some different examples, the differences in the dielectric constant κ of the dielectric regulating structures 3 are realized by using different dopants and/or doping concentration. The dopants and/or the doping concentration of the dielectric regulating structures 3 may be the same as or different from one another. In some further embodiments, the dielectric regulating structures 3 have a dielectric constant κ that is greater than 15. The dielectric regulating structures 3 have a higher dielectric constant κ than the dielectric layer 5. FIGS. 2-22 are various example embodiments of the dielectric regulating structures 3. The transition line structure 1 thus has high dielectric constant sections (also referred to as higher impedance sections, e.g., dielectric regulating structures 3) and low dielectric constant sections (also referred to as low impedance sections, e.g., the dielectric layer 5). The dielectric constant κ of the transmission line structure 1 can be regulated (or tuned, adjusted) by the dielectric regulating structures 3, such as the by materials, shapes, dimensions, dopants, and/or doping concentrations of the dielectric structures 3. The incorporating of the dielectric regulating structures 3 results in an adjusted wavelength λ of the signal travelling in the signal line 2 according to equation (1).

Figure 2:
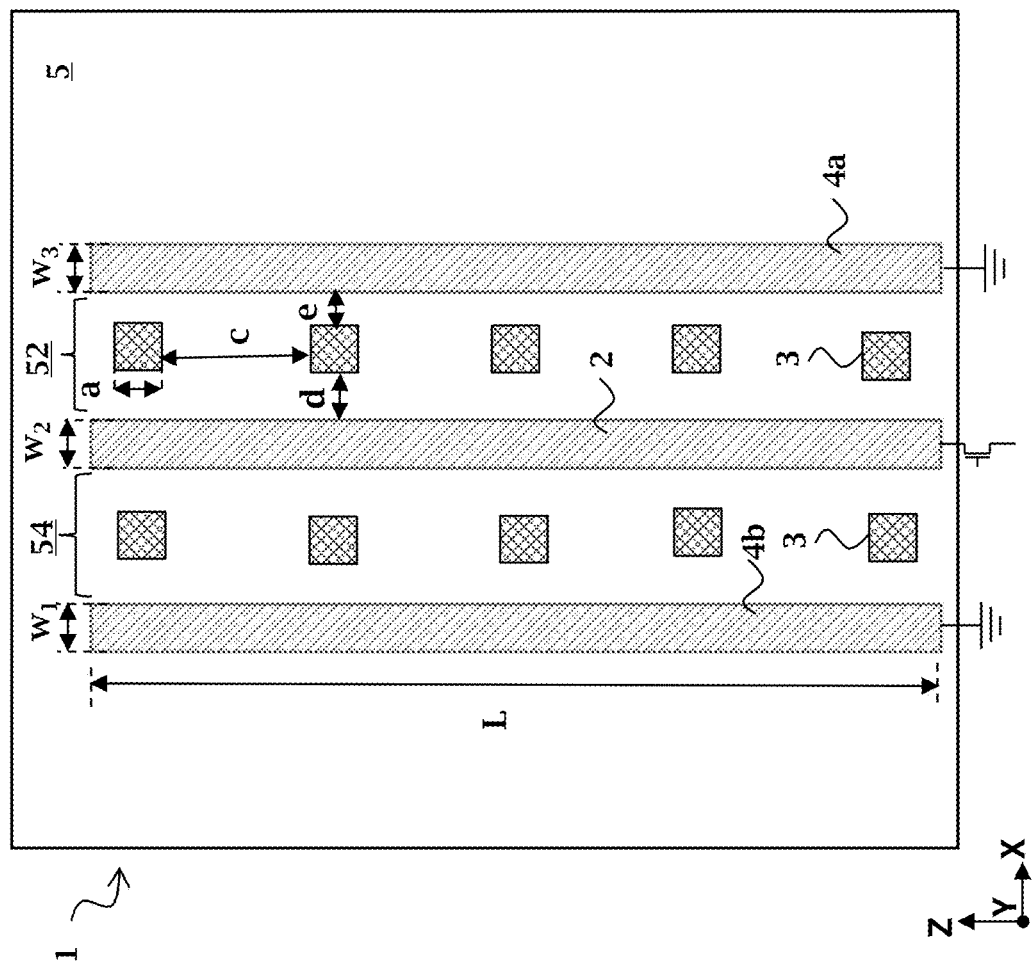
FIGS. 2-8 illustrate top views of transmission line structures, according to various embodiments of the present disclosure.

FIG. 2 illustrates a top view of an embodiment of a transmission line structure 1. The dielectric regulating structures 3 are disposed in sections 52 and 54 of the dielectric layer 5. The section 52 is disposed between the signal line 2 and the ground line 4a and the section 54 is disposed between the signal line 2 and the ground line 4b. The dielectric regulating structures 3 in the section 52 and the dielectric regulating structures 3 in the section 54 are aligned along straight lines perpendicular to a lengthwise direction (z direction) of the conductive lines 2, 4a, and 4b. The dielectric regulating structures 3 in the section 52 are substantially symmetric to the dielectric regulating structures 3 in the section 54 along a lengthwise center line of the signal line 2. The dielectric regulating structures 3 in the section 52 are discussed hereafter for illustration purposes.

In the depicted embodiments, the dielectric regulating structures 3 are cubes isolated from one another and are therefore also referred to as the dielectric islands 3. An edge of the dielectric regulating structures 3 has a length a that equals the height H of the signal line 2. In some embodiments, the length a is about 10 μm to about 1,000 μm. The dielectric regulating structures 3 are disposed along a lengthwise center line of the section 52, where a gap d between the signal line 2 and the dielectric regulating structures 3 equals a gap e between the ground line 4a and the dielectric regulating structures 3. In the present embodiments, the dielectric regulating structures 3 are spaced apart from one another along the lengthwise direction (z direction) of the conductive lines 2, 4a, and 4b. A spacing c between two adjacent dielectric regulating structures 3 along the lengthwise direction (z direction) may be uniform or may vary. In some embodiments, the dielectric regulating structures 3 have uniform spacing c along the entire length of the conductive lines 2, 4a, and 4b. In some embodiments, the spacing c is about 0.5 μm to about 10 μm. In some embodiments, the spacing c is about 0.5 μm to about 10 μm when length a is about 1 μm. The uniform distribution of the dielectric regulating structures 3 along the z direction simplifies the design and calculation of the transmission line structure 1 compared to random distribution.

The dimensions and the spacings of the dielectric regulating structures 3 are designed to achieve the required length L of the conductive lines 2, 4a, and 4b. Increasing the dimensions or decreasing the spacings of the dielectric regulating structures 3 increases the dielectric constant κ of the dielectric layer 5, since the dielectric regulating structures 3 have higher dielectric constant κ than the dielectric constant $κ_0$ of the dielectric layer 5. The increasing of the dielectric constant κ, in turn, decreases the wavelength λ of the signal traveling through the conductive line (or signal line) 2 according to the equation (1) discussed in detail above. Therefore, the length L of the conductive lines 2, 4a, and 4b (such as half-wavelength or quarter wavelength conductive lines) is reduced accordingly. If the dielectric constant κ, dimensions and spacing of the dielectric regulating structures 3 are less than the lower limits discussed above, the dielectric constant κ would not be sufficiently high to reduce the wavelength λ to the design requirements. On the other hand, if the dielectric constant κ, dimensions and spacing of the dielectric regulating structures 3 are greater than the upper limits of the ranges discussed above, the signal loss caused by the dielectric regulating structures 3 would be too much to effectively transmit signals through the signal line 2. It is understood that the configurations of the transmission line structures 1 are not limited by FIG. 2 and may comprise any combinations and configurations of signal lines, ground lines, and dielectric regulating structures. FIGS. 3-22 are example embodiments alternative to the embodiments depicted in FIG. 2.

Figure 3:
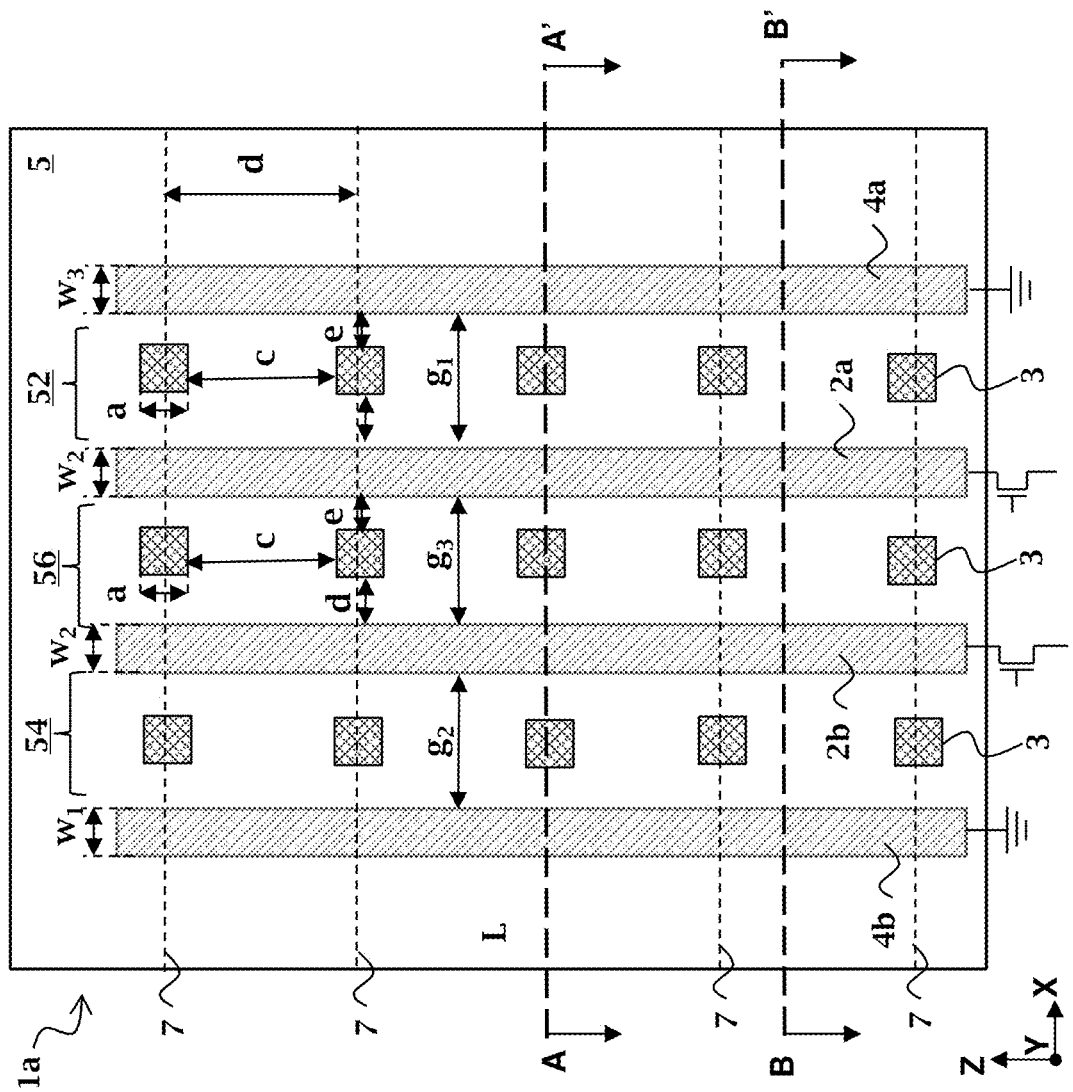

FIG. 3 illustrates a top view of an alternative embodiment of a transmission line structure 1a. The embodiments depicted in FIG. 3 is similar to the embodiments depicted in FIGS. 1 and 2, except two signal lines 2a and 2b are disposed between the ground lines 4a and 4b. The signal lines 2a and 2b are a subset of (or belong to) the signal line 2, therefore the discussion with respect to signal line 2 above applies equally to the signal lines 2a and 2b. The signal lines 2a and 2b may be different in dimensions, forming method, and materials in some embodiments. A gap $g_3$ between the signal lines 2a and 2b may be the same as or different from the gap $g_1$ and/or the gap $g_2$. In the present embodiments, the signal lines 2a and 2b are identical in dimensions and materials and are formed simultaneously. The gap $g_3$ equals the gap $g_1$ and the gap $g_2$. The dielectric regulating structures 3 are disposed in a section 56 of the dielectric layer 5 between the signal lines 2a and 2b. The dielectric regulating structures 3 in the section 56 are symmetric to the dielectric regulating structures 3 in the section 52 along a lengthwise center line of the signal line 2a. The dielectric regulating structures 3 in the section 56 are symmetric to the dielectric regulating structures 3 in the section 54 along a lengthwise center line of the signal line 2b.

The dielectric regulating structures 3 are disposed along planes 7, where the planes 7 are parallel planes perpendicular to the lengthwise direction (z direction) of the conductive lines 2a, 2b, 4a, and 4b. The planes 7 divide each of the dielectric regulating structures 3 in half. The planes 7 are parallel to two faces of each dielectric regulating structures 3. Each of the planes 7 divides one or more of the dielectric regulating structures 3. Each of the planes 7 divides the same numbers of the dielectric regulating structures 3. The planes 7 are spaced apart and disposed along the lengthwise direction (z direction) of the transmission line structure 1a. The spacing between the planes 7 may vary in some embodiments. In the present embodiments, the planes 7 have a uniform spacing d. The geometry, dimensions, materials, and spacing of the dielectric regulating structures 3 disposed in the planes 7 are designed to regulate the dielectric constant κ of the dielectric layer 5, such that the wavelength λ of the signals can be regulated accordingly.

Figure 4:
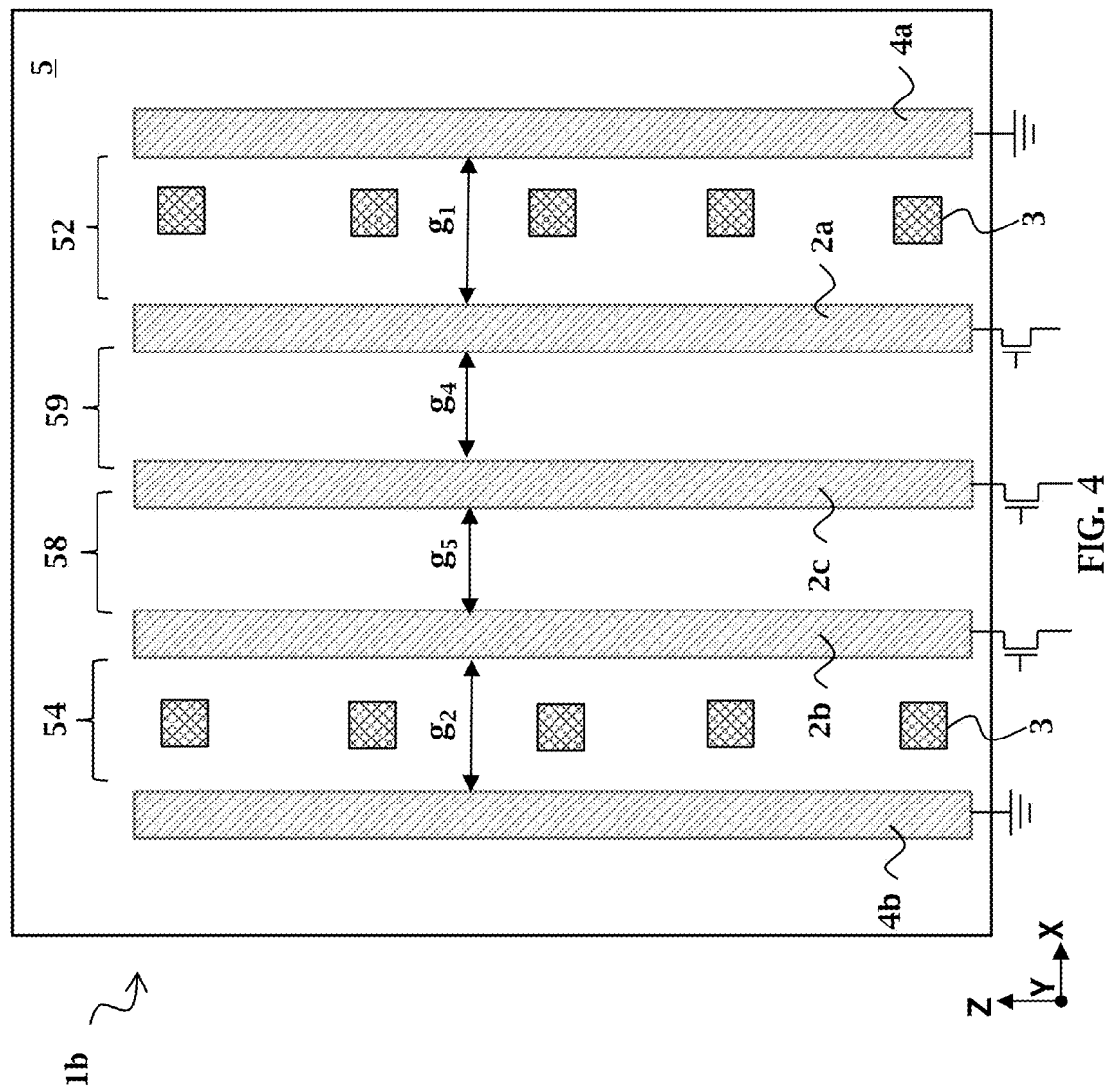

FIG. 4 illustrates a top view of an embodiment of the transmission line structure 1b. The embodiments depicted in FIG. 4 are similar to the embodiments depicted in FIGS. 1 and 2, except three signal lines 2a, 2b, and 2c are disposed between the ground lines 4a and 4b. The signal lines 2a, 2b, and 2c are a subset of (or belong to) the signal line 2, therefore the discussion with respect to signal line 2 above applies equally to the signal lines 2a, 2b, and 2c. The signal lines 2a, 2b, and 2c may be different in dimensions, forming method, and materials in some embodiments. A gap $g_4$ between the signal lines 2a and 2c may be the same as or different from a gap $g_5$ between the signal line 2b and 2c. In the present embodiments, the signal lines 2a, 2b, and 2c are identical in dimensions and materials and are formed simultaneously. The gap $g_4$ is same as the gap $g_5$, both of which equal the gaps $g_1$ and $g_2$. The dielectric regulating structures 3 are disposed in a section 52 between the signal line 2a and the ground line 4a and a section 54 between the signal lines 2b and the ground line 4b. The dielectric regulating structures 3 in the section 54 are symmetric to the dielectric regulating structures 3 in the section 52 along a lengthwise center line of the signal line 2c. A section 58 between the signal lines 2b and 2c and a section 59 between the signal lines 2a and 2c are free from the dielectric regulating structures 3.

Figure 5:
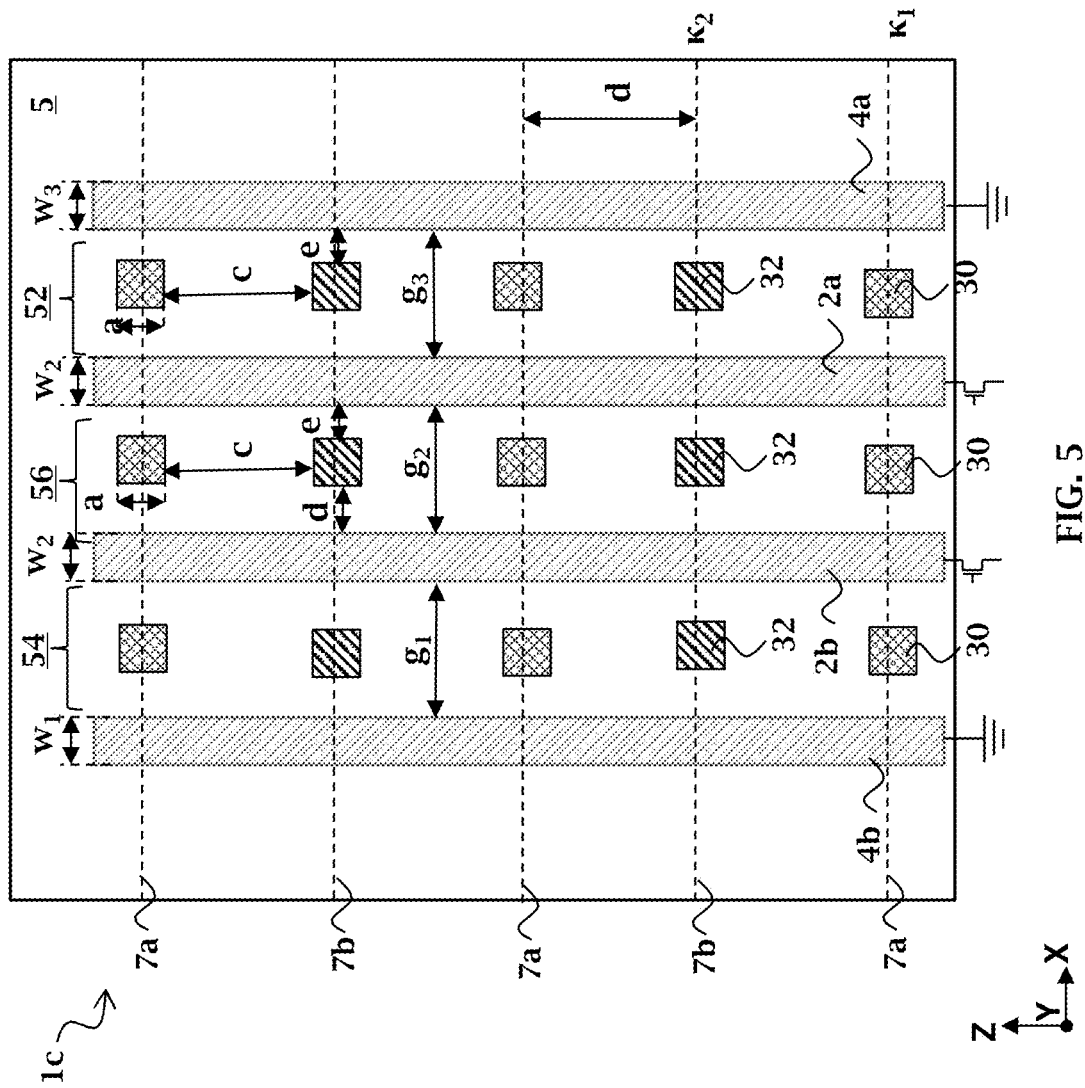

FIG. 5 illustrates a top view of an embodiment of a transmission line structure 1c. The embodiments depicted in FIG. 5 are similar to the embodiments depicted in FIG. 3, except half of the dielectric regulating structures 3 are replaced by the dielectric regulating structures 30 and another half by the dielectric regulating structures 32. The dielectric regulating structures 30 are disposed along planes 7a and the dielectric regulating structures 32 are disposed along the planes 7b. The planes 7a and 7b are alternately disposed along the lengthwise direction (z direction) of the conductive lines 2a, 2b, 4a, and 4b. The dielectric regulating structures 30 and 32 are subsets of the dielectric regulating structures 3, therefore the discussion with respect to the dielectric regulating structures 3 above applies equally to the dielectric regulating structures 30 and 32. The planes 7a and 7b are subsets of the planes 7, therefore the discussion with respect to the plane 7 above applies equally to the planes 7a and 7b. Each of the planes 7a divides one or more of the dielectric regulating structures 30 and does not divide the dielectric regulating structures 32. Each of the planes 7b divides one or more of the dielectric regulating structures 32 and does not divide the dielectric regulating structures 30. In some embodiments, the dielectric regulating structures 30 and 32 includes different materials. In some embodiments, the dielectric regulating structures 30 and 32 are doped sections of the dielectric layer 5 with different dopants. In some embodiments, the dielectric regulating structures 30 and 32 are doped sections of the dielectric layer 5 with the same dopants but different doping concentration. For example, dielectric regulating structures 30 has a higher doping concentration than the dielectric regulating structures 32. In some embodiments, the dielectric regulating structures 30 have a dielectric constant $\kappa_1$ that is different from the dielectric constant $\kappa_2$ of the dielectric regulating structures 32. In some embodiments, the dielectric constant $\kappa_2$ is about 7 to about 15. In some embodiments, the dielectric constant $\kappa_1$ equals or is greater than 15. The different materials, dopants, dopant concentrations, and dielectric constants of the dielectric regulating structures 30 and 32 provide flexible design choices.

Figure 6:
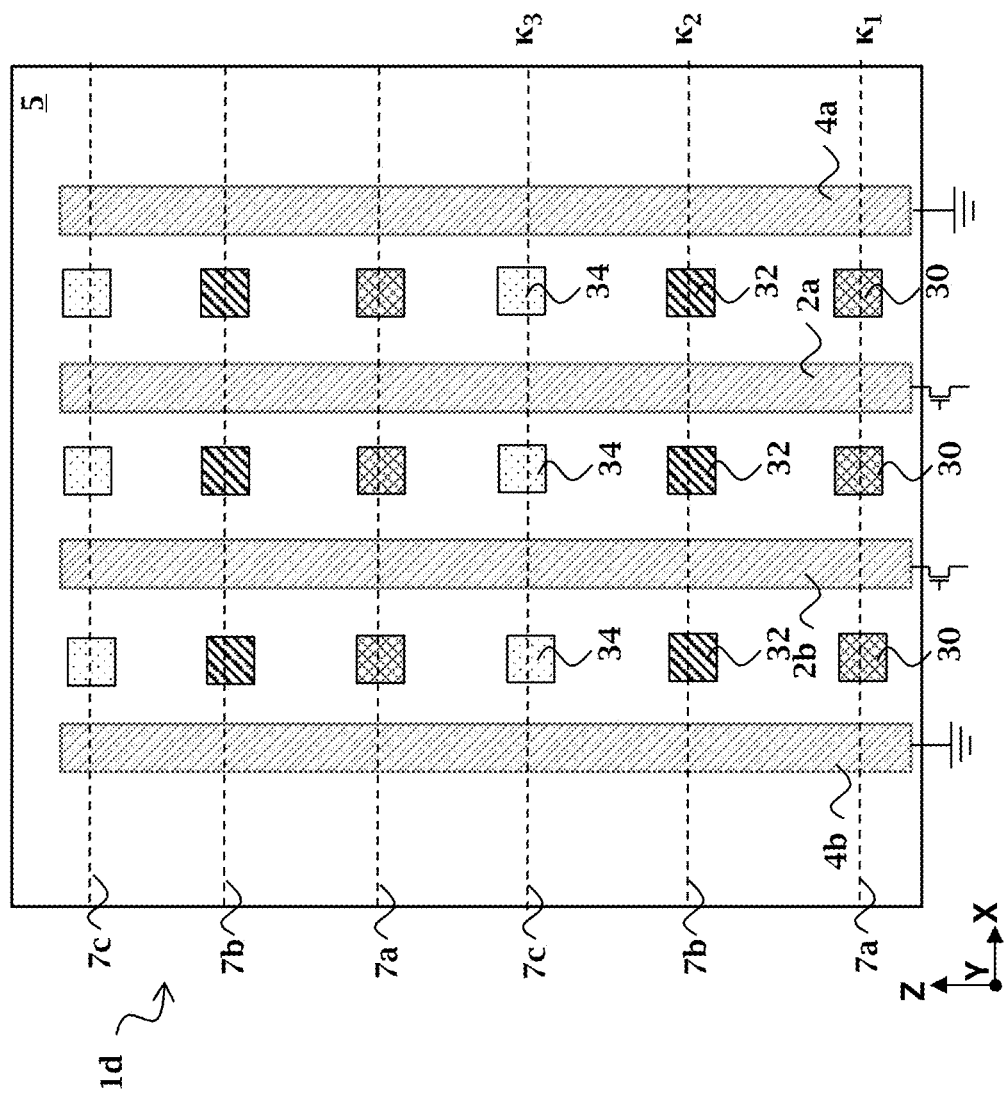

FIG. 6 illustrates a top view of an embodiment of a transmission line structure 1d. The embodiments depicted in FIG. 6 are similar to the embodiments depicted in FIG. 3, except a third of the dielectric regulating structures 3 are replaced by the dielectric regulating structures 30, another third by the dielectric regulating structures 32, and the last third by dielectric regulating structures 34. The dielectric regulating structures 30, 32, and 34 are disposed along planes 7a, 7b, and 7c, respectively. The planes 7a, 7b, and 7c are disposed along the lengthwise direction (z direction) of the conductive lines 2a, 2b, 4a, and 4b in a periodical interval. The dielectric regulating structures 30, 32, and 34 are subsets of the dielectric regulating structures 3, therefore the discussion with respect to the dielectric regulating structures 3 above applies equally to the dielectric regulating structures 30, 32, and 34. The planes 7a, 7b, and 7c are subsets of the planes 7, therefore the discussion with respect to the plane 7 above applies equally to the planes 7a, 7b, and 7c. Each of the planes 7a divides one or more of the dielectric regulating structures 30 and does not divide the dielectric regulating structures 32 and 34. Each of the planes 7b divides one or more of the dielectric regulating structures 32 and does not divide the dielectric regulating structures 30 and 34. Each of the planes 7c divides one or more of the dielectric regulating structures 34 and does not divide the dielectric regulating structures 30 and 32.

The dielectric regulating structures 30, 32, and 34 have dielectric constant $\kappa_1$, $\kappa_2$, and $\kappa_3$, respectively. The dielectric constant $\kappa_1$, $\kappa_2$, and $\kappa_3$ are different from one another and are all greater than 7. In some embodiments, the dielectric constant $\kappa_1$ is greater than the dielectric constant $\kappa_2$ and the dielectric constant $\kappa_2$ is greater than the dielectric constant $\kappa_3$. In some embodiments, the dielectric constant $\kappa_1$ equals or is greater than 15. The different dielectric constants of the dielectric regulating structures 30, 32, and 34 provide flexible design choices. The periodic distribution of the dielectric regulating structures 30, 32, and 34 provide simplicity for calculating and modeling the dielectric regulating structures 3 for given design requirements.

Figure 7:
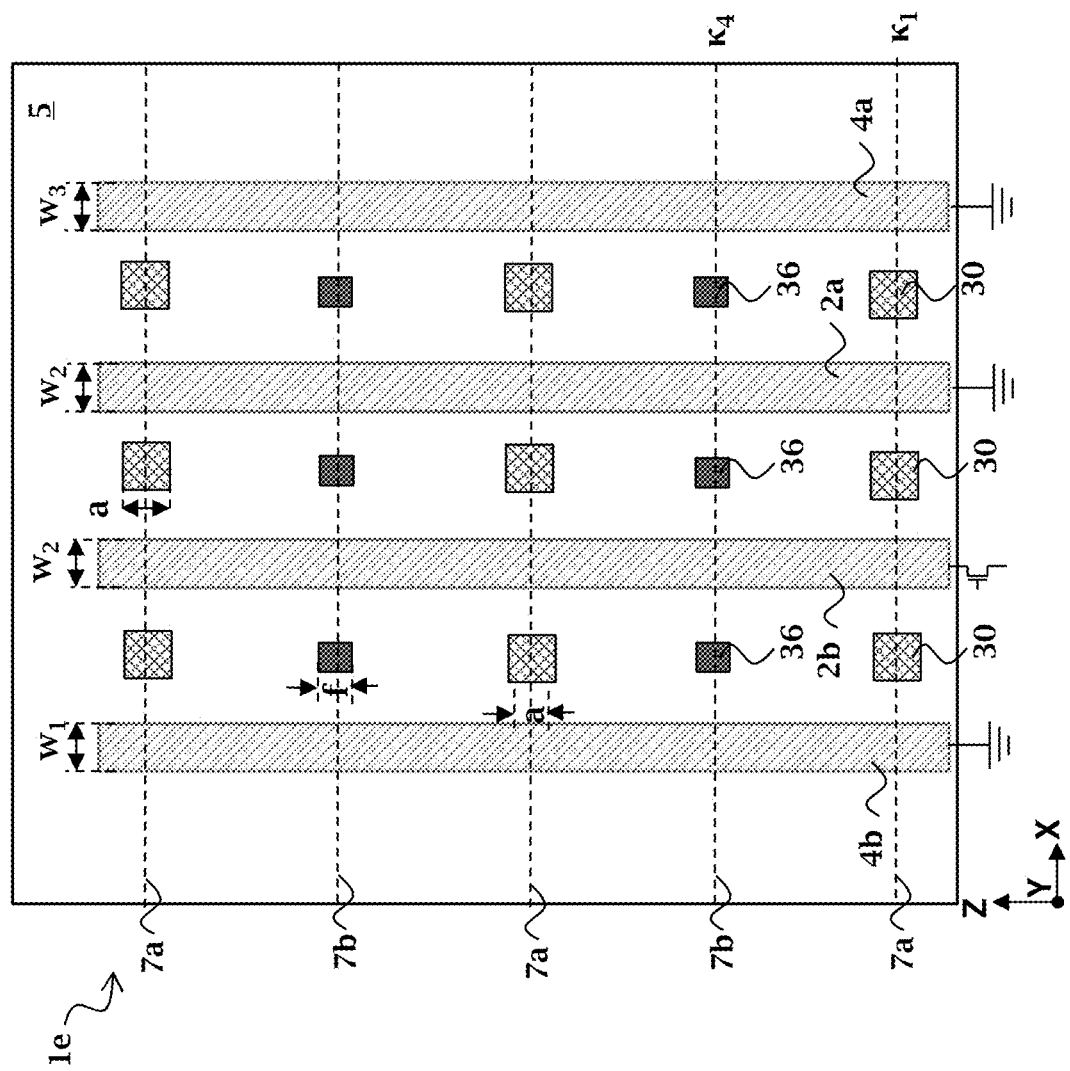

FIG. 7 illustrates a top view of an embodiment of a transmission line structure 1e. The embodiments depicted in FIG. 7 are similar to the embodiments depicted in FIG. 5, except the dielectric regulating structures 32 are replaced by the dielectric regulating structures 36. The dielectric regulating structures 36 are a subset of the dielectric regulating structures 3, therefore the discussion with respect to the dielectric regulating structures 3 above applies equally to the dielectric regulating structures 36. The dielectric regulating structures 36 have sizes that are smaller than the sizes of the dielectric regulating structures 30. For example, the dielectric regulating structures 36 are cuboids with an edge having length b, where the length b is less than the length a.

In some embodiments, the dielectric regulating structures 30 and 36 includes different materials. In some embodiments, the dielectric regulating structures 30 and 36 are doped sections of the dielectric layer 5 with the same dopants and the same doping concentrations for each of the dopants. In some embodiments, the dielectric regulating structures 30 and 36 are doped sections of the dielectric layer 5 with the same dopants but different doping concentration. For example, dielectric regulating structures 30 has a higher concentration than the dielectric regulating structures 32. In some embodiments, the dielectric regulating structures 30 and 32 are doped sections of the dielectric layer 5 with different dopants. In some embodiments, a dielectric constant $\kappa_4$ of the dielectric regulating structure 36 may be the same as or different from the dielectric constant $\kappa_2$. In one example, the dielectric constant $\kappa_4$ is greater than the dielectric constant $\kappa_1$. In a different example, the dielectric constant $\kappa_4$ is less than the dielectric constant $\kappa_1$. In the present embodiments, the dielectric constant $\kappa_1$ is greater than the dielectric constant $\kappa_4$, and the dielectric constant $\kappa_4$ is greater than the dielectric constant $\kappa_2$. The larger dielectric regulating structures 30 with lower dielectric constant $\kappa_2$ can be replaced by the smaller dielectric regulating structures 36 with higher dielectric constant $\kappa_4$. The different sizes of the dielectric regulating structures 30 and 36 provides further design flexibility to achieve the design requirements.

Figure 8:
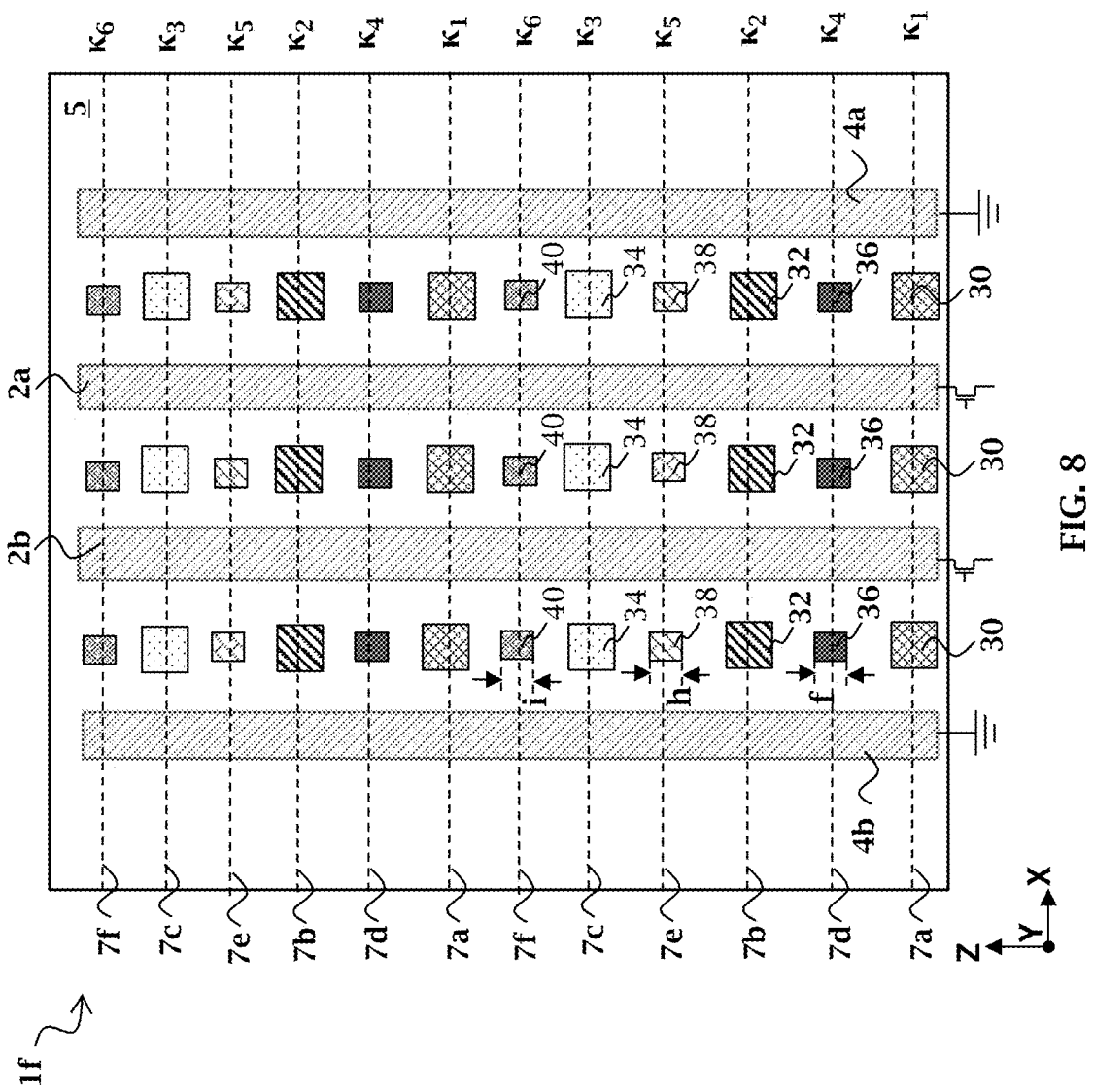

FIG. 8 illustrates a top view of an embodiment of a transmission line structure 1f. The embodiments depicted in FIG. 8 are similar to the embodiments depicted in FIG. 6, except half of the dielectric regulating structures 30, 32, and 34 are replaced by the dielectric regulating structures 36, 38, and 40, respectively. The dielectric regulating structures 36, 38, and 40 are disposed in planes 7d, 7e, and 7f, respectively, where the planes 7d, 7e and 7f are subsets of the planes 7. The planes 7a, 7d, 7b, 7e, 7c, and 7f are disposed periodically in the listed order along the lengthwise direction (z direction) of the conductive lines 2a, 2b, 4a, and 4b. The dielectric regulating structures 36, 38, and 40 are subsets of the dielectric regulating structures 3. The dielectric regulating structures 36, 38, and 40 may have sizes that are the same as or different from one another, but all of them are smaller than the sizes of the dielectric regulating structures 30, 32, and 34. In the present embodiments the dielectric regulating structures 36, 38, and 40 have the same size. The dielectric regulating structures 36, 38, and 40 have dielectric constants of $\kappa_4$, $\kappa_5$, and $\kappa_6$, respectively. The dielectric constants of $\kappa_4$, $\kappa_5$, and $\kappa_6$ may be the same as or different from one another. In one example, the dielectric constant $\kappa_4$ is greater than the dielectric constant $\kappa_1$. In a different example, the dielectric constant $\kappa_5$ is less than the dielectric constant $\kappa_2$. In a further example, a dielectric constant $\kappa_6$ equals the dielectric constant $\kappa_3$.

Figure 9:
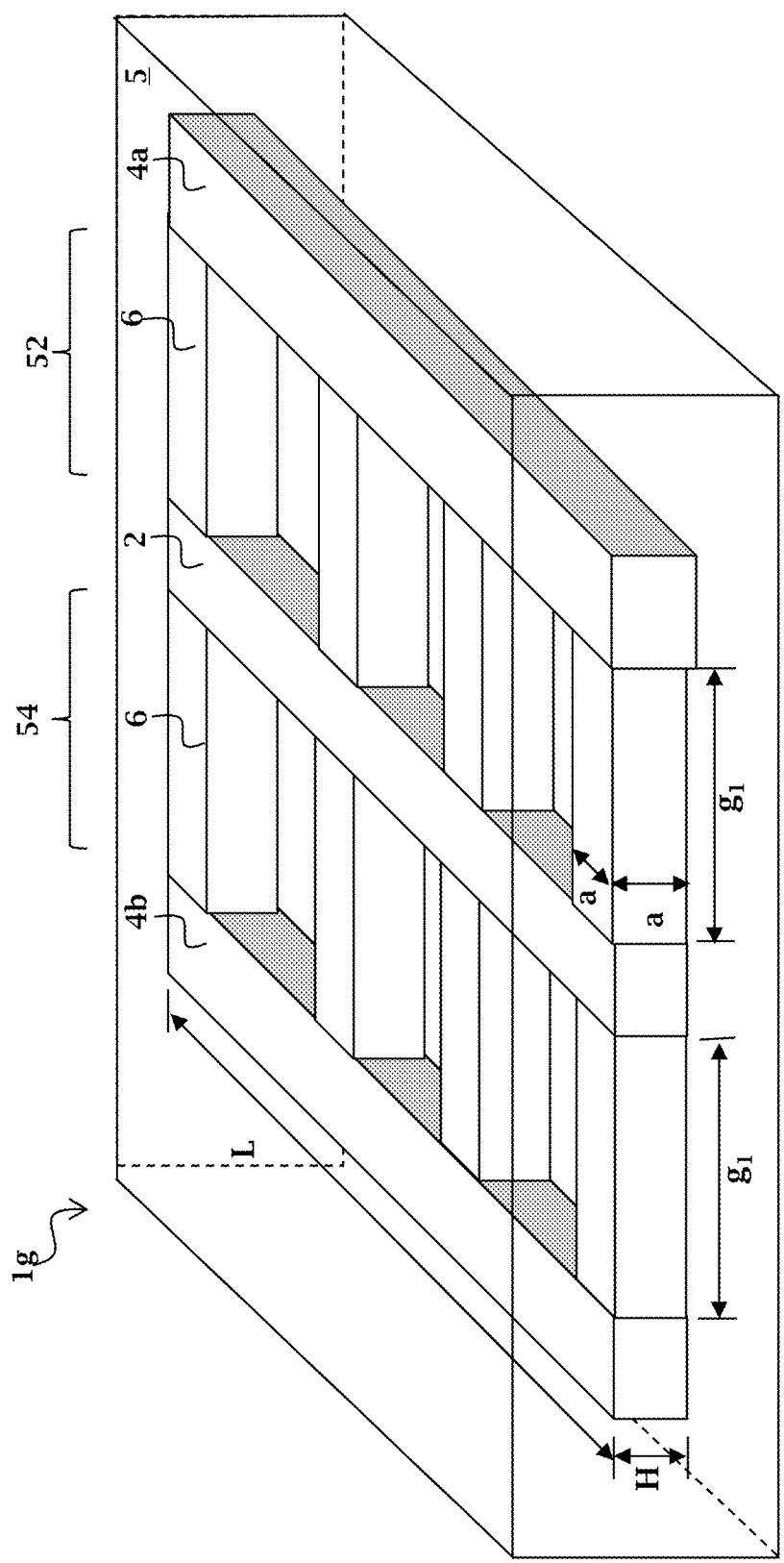
FIG. 9 illustrates a perspective view of an embodiment of a transmission line structure, according to various embodiments of the present disclosure.

FIG. 9 illustrates a 3-D perspective view of an embodiment of a transmission line structure 1g. The embodiments depicted in FIG. 9 are similar to the embodiments depicted in FIGS. 1 and 2, except the cubic dielectric regulating structures 3 are replaced by cuboid dielectric regulating structures 6. The dielectric regulating structures 6 are also referred to as the dielectric bars. A width and a height of each dielectric regulating structures 6 are the length a. The dielectric regulating structures 6 are a subset of the dielectric regulating structures 3 and therefore fit in the descriptions of the dielectric regulating structures 3 discussed above. The dielectric regulating structures 6 are disposed lengthwise perpendicular to the lengthwise direction of the conductive lines 2a, 2b, 4a, and 4b. Each of the dielectric regulating structures 6 contacts the adjacent conductive lines 2a, 2b, 4a, and 4b. That is, each of the dielectric regulating structures 6 spans across the adjacent conductive lines 2a, 2b, 4a, and 4b and having the length of $g_1$.

Figure 10:
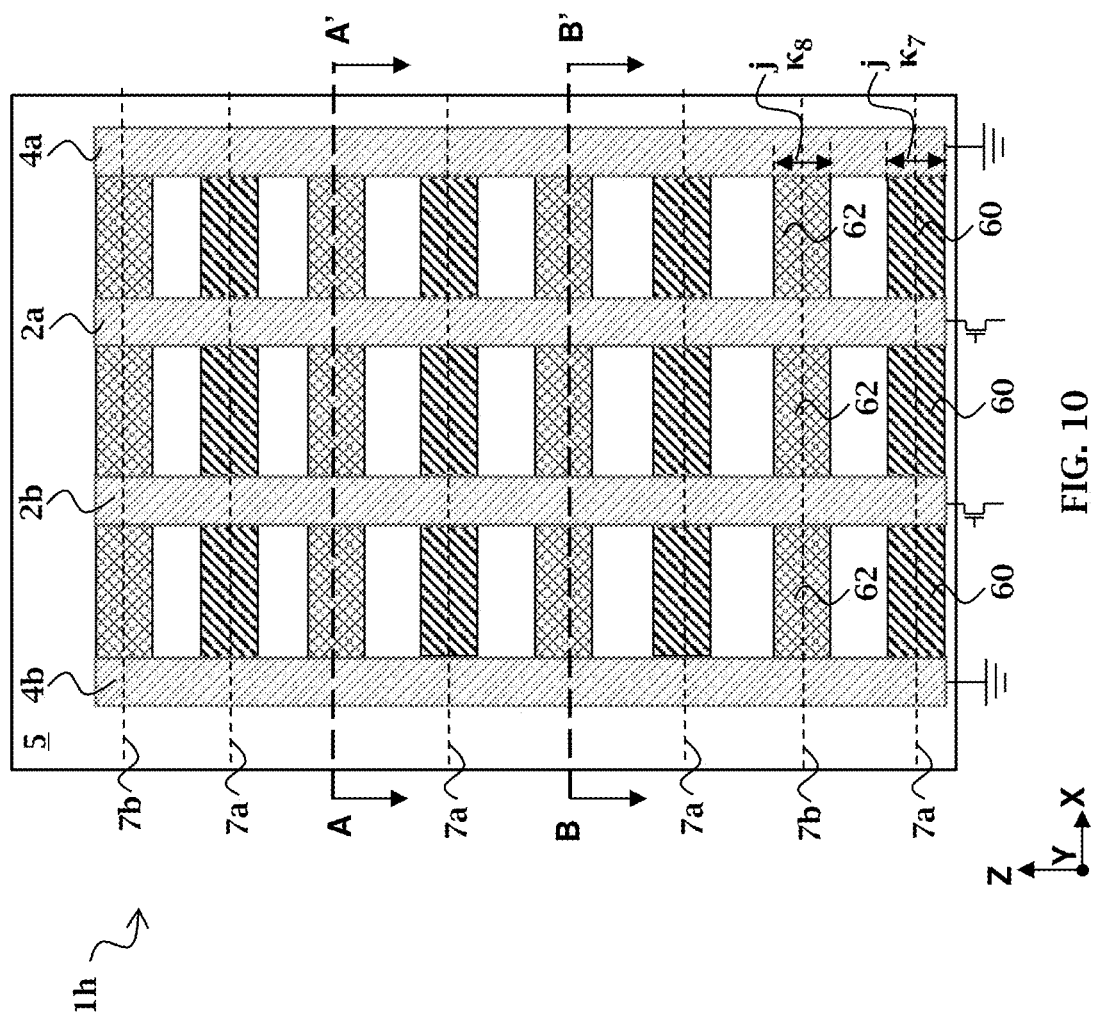
FIGS. 10-12 illustrate top views of transmission line structures, according to various embodiments of the present disclosure.

FIG. 10 illustrates a top view of an embodiment of a transmission line structure 1h. The embodiments depicted in FIG. 10 are similar to the embodiments depicted in FIG. 9, except half of the dielectric regulating structures 6 are replaced by the dielectric regulating structures 60 and another half by the dielectric regulating structures 62. The dielectric regulating structures 60 and 62 are disposed along the planes 7a and 7b, respectively. The planes 7a and 7b are subsets of the planes 7 alternatively disposed along the lengthwise direction (z direction) of the transmission line structure 1h. The dielectric regulating structures 60 and 62 are subsets of the dielectric regulating structures 6. The dielectric regulating structures 60 and 62 have the same geometry and dimensions. A dielectric constant $\kappa_7$ of the dielectric regulating structure 60 is greater than a dielectric constant $\kappa_8$ of the dielectric regulating structure 62. In some embodiments, the dielectric constant $\kappa_7$ is greater than 15. In some embodiments, the dielectric constant $\kappa_8$ is about 7 to about 15.

Figure 11:
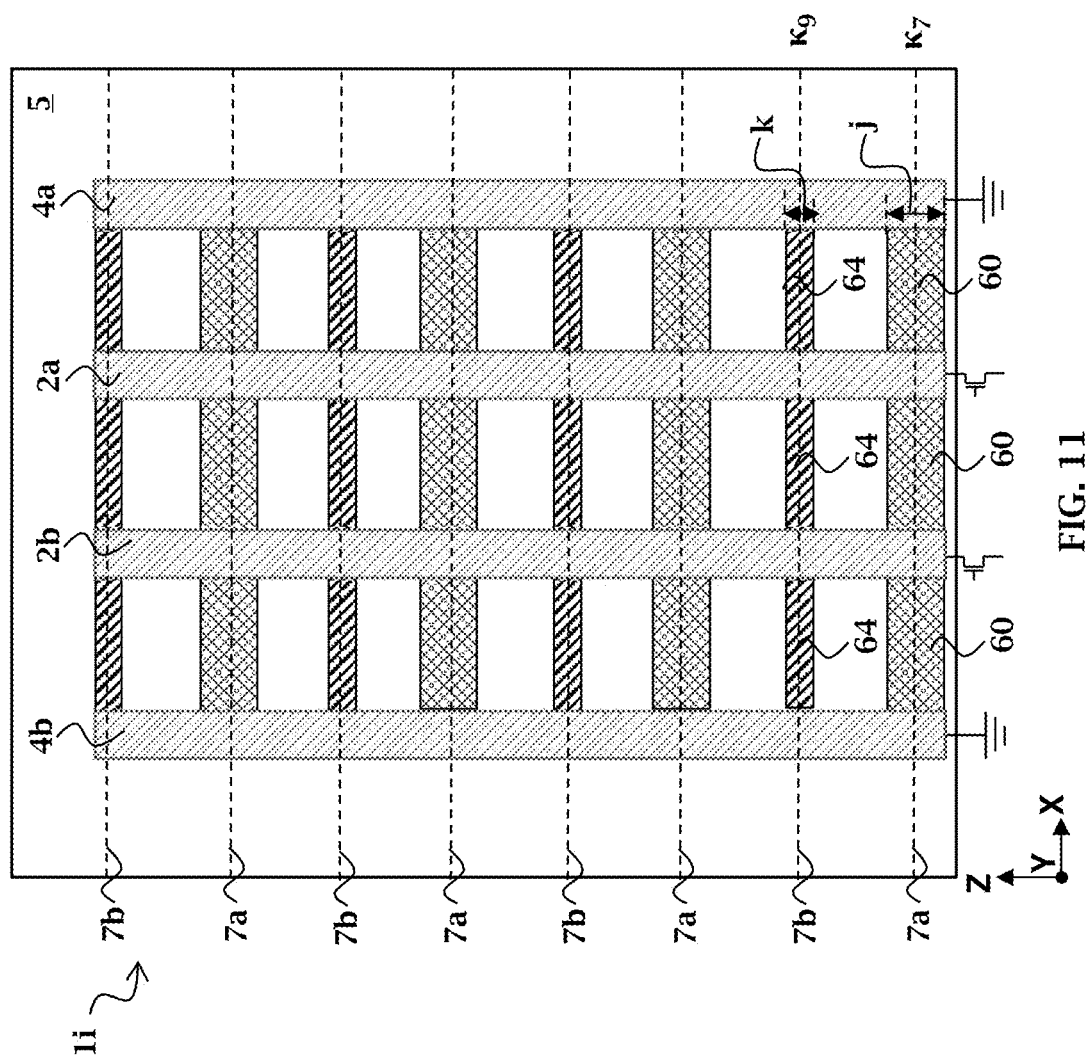

FIG. 11 illustrates a top view of an embodiment of a transmission line structure 1i. The embodiments depicted in FIG. 11 are similar to the embodiments depicted in FIG. 10, except the dielectric regulating structures 62 are replaced by the dielectric regulating structures 64. The dielectric regulating structures 64 are a subset of the dielectric regulating structures 6. A width k of the dielectric regulating structures 64 is less than a width j of the dielectric regulating structures 60. A dielectric constant $\kappa_9$ of the dielectric regulating structure 64 is greater than a dielectric constant $\kappa_8$ of the dielectric regulating structure 62 but less than the dielectric constant $\kappa_7$. The greater dielectric constant $\kappa_9$ compared to the dielectric constant $\kappa_8$ enables the dielectric regulating structure 64 to be narrower than the dielectric regulating structure 62 (k<j). In other words, the same overall dielectric constant $\kappa$ of the transmission line structure 1i can be achieved by narrower dielectric regulating structure 64 with higher dielectric constant $\kappa_9$, or wider dielectric regulating structure 62 with lower dielectric constant $\kappa_8$.

Figure 12:
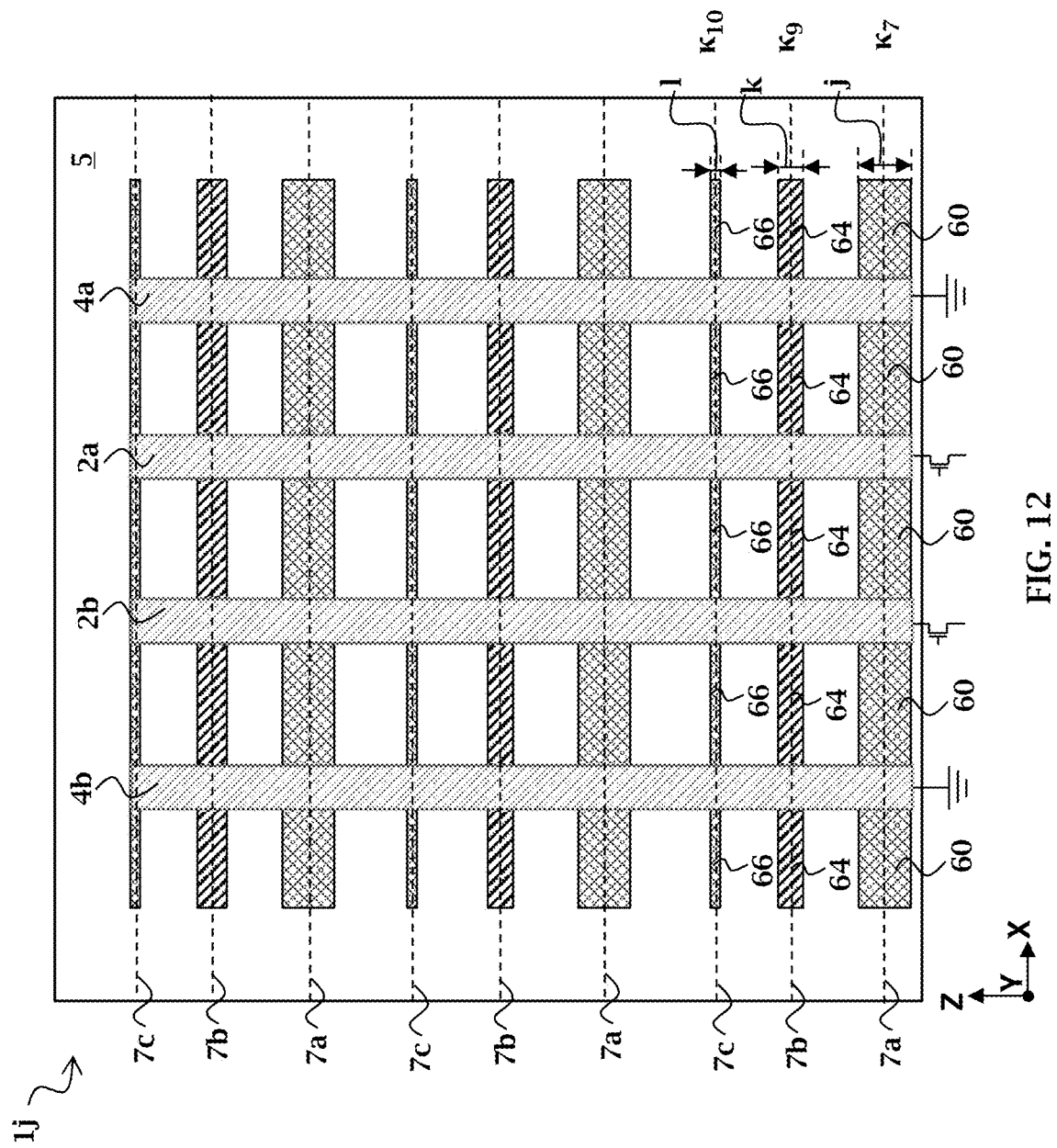

FIG. 12 illustrates a top view of an embodiment of a transmission line structure 1j. The embodiments depicted in FIG. 12 are similar to the embodiments depicted in FIG. 11, except half of the dielectric regulating structures 64 are replaced by the dielectric regulating structures 66. The dielectric regulating structures 66 are subsets of the dielectric regulating structures 6. A width l of the dielectric regulating structures 64 is less than the width k of the dielectric regulating structures 64. A dielectric constant $\kappa_{10}$ of the dielectric regulating structure 66 is less than a dielectric constant $\kappa_9$ of the dielectric regulating structure 64. The dielectric regulating structures 60, 64, and 66 are in the planes 7a, 7b, and 7c, respectively, where the planes 7a, 7b, and 7c are disposed at periodic intervals along the entire length of the transmission line structure 1j. The periodic distribution of the planes 7a, 7b, and 7c ensures the signal travels through the signal lines 2a and 2b predictably, therefore simplifies the modeling and/or calculating of the length of the transmission line structures 1j in required designs.

Figure 13:
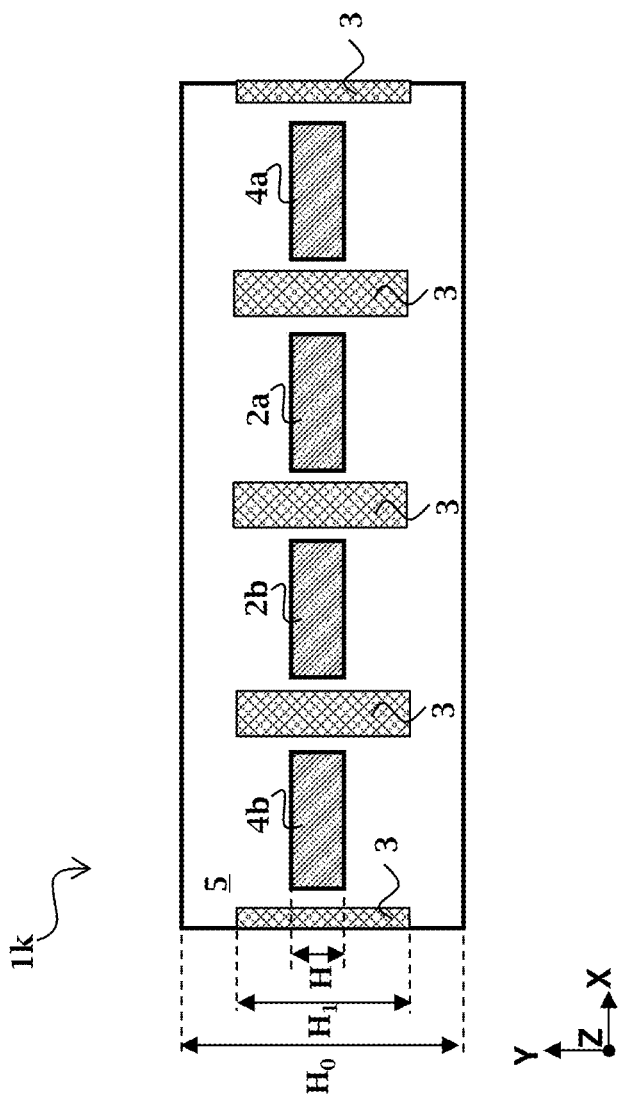
FIGS. 13-22 illustrate cross-sectional views of transmission line structures, according to various embodiments of the present disclosure.
Figure 14:
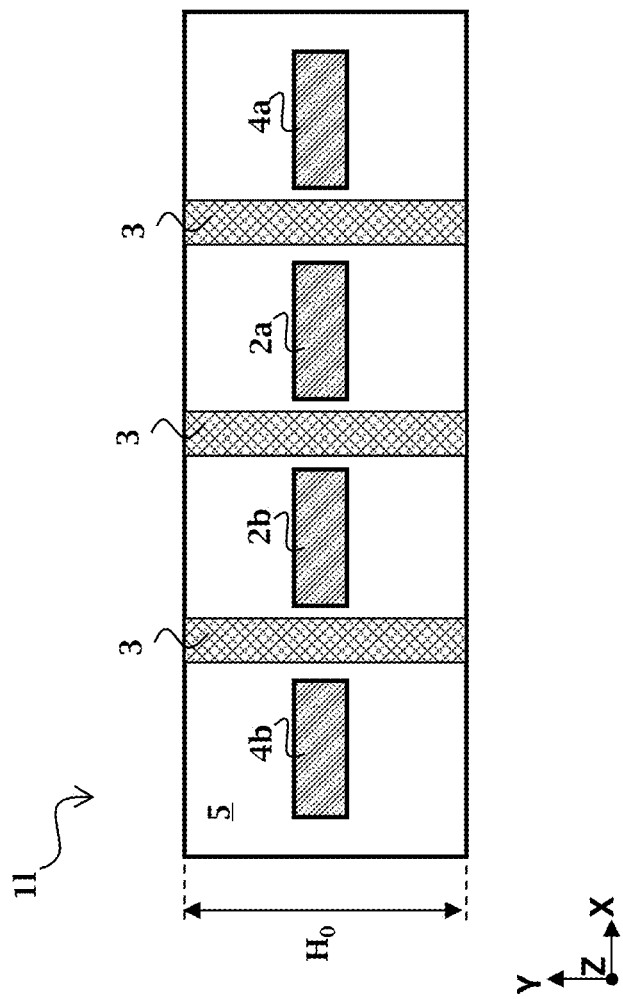

FIGS. 13-22 illustrate cross-sectional views of embodiments of the transmission line structures 1k-1t along the line A-A' in FIGS. 3 and 10. Referring to FIG. 13, the dielectric regulating structures 3 have a uniform height $H_1$ that is greater than the height H of signal lines 2a and 2b and the ground lines 4a and 4b. The signal lines 2a and 2b and the ground lines 4a and 4b are collectively referred to as conductive lines hereafter. The top surfaces of the dielectric regulating structures 3 are coplanar and above (along y direction) the surfaces of the conductive lines. Bottom surfaces of the dielectric regulating structures 3 are coplanar and beneath (along y direction) bottom surfaces of the conductive lines. The height $H_1$ is less than or equal to a height $H_0$ of the dielectric layer 5. For example, the height $H_1$ equals the height $H_0$ in the embodiments depicted in FIG. 14. That is, the dielectric regulating structures 3 penetrate through the entire thickness of the dielectric layer 5 along the y direction. The increasing of the height $H_1$ increases the overall dielectric constant $\kappa$ of the dielectric layer 5, thereby decreasing the wavelength $\lambda$ of the signal transmitted along the signal lines 2a and 2b. The decreased wavelength $\lambda$ in turn enables the reduction of the lengths of the conductive lines.

Figure 15:
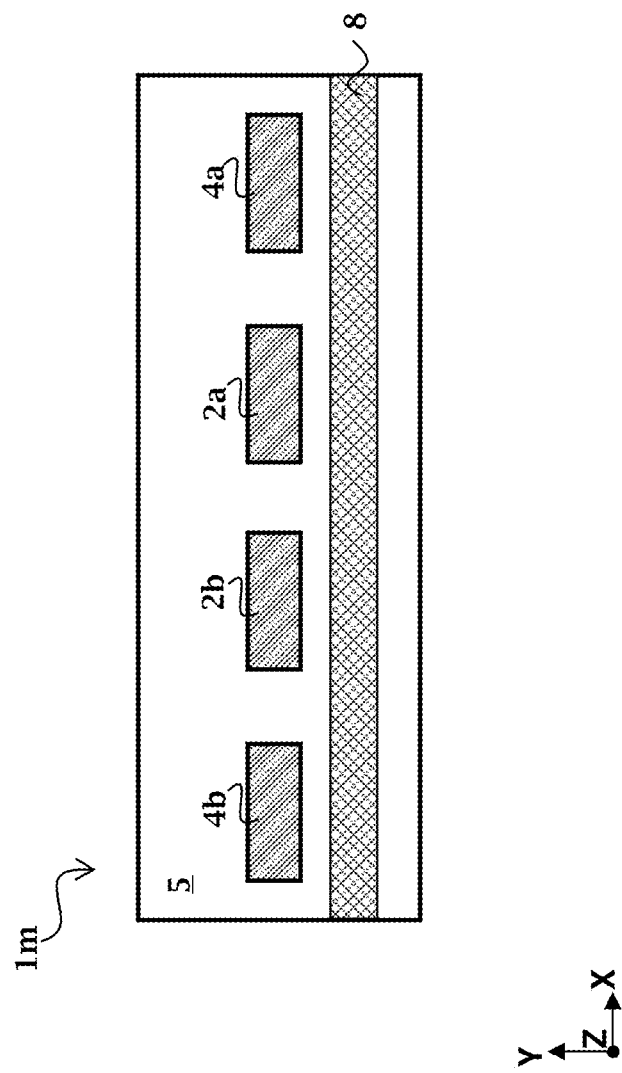
Figure 16:
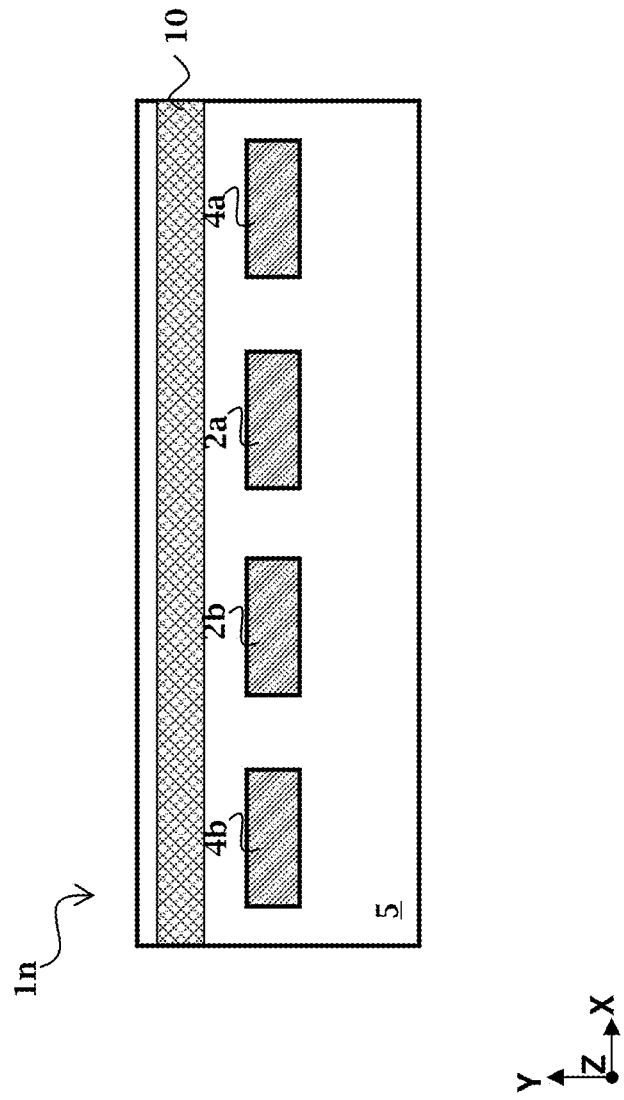

FIGS. 15 and 16 illustrate cross-sectional views of embodiments of the transmission line structure 1m and 1n along the line A-A' in FIGS. 3 and 10. Instead of being disposed between the conductive lines, the dielectric regulating structures 8 are disposed beneath the conductive lines as illustrated in FIG. 15 and the dielectric regulating structures 10 are disposed above the conductive lines as illustrated in FIG. 16. The dielectric regulating structures 8 and 10 are cuboids disposed along a same plane 7 and lengthwise along the x direction. The lengthwise center line of the dielectric regulating structures 8 and 10 are in the same plane 7. The lengthwise direction (x direction) of the dielectric regulating structures 8 and 10 is perpendicular to the lengthwise direction (z direction) of the conductive lines.

Figure 17:
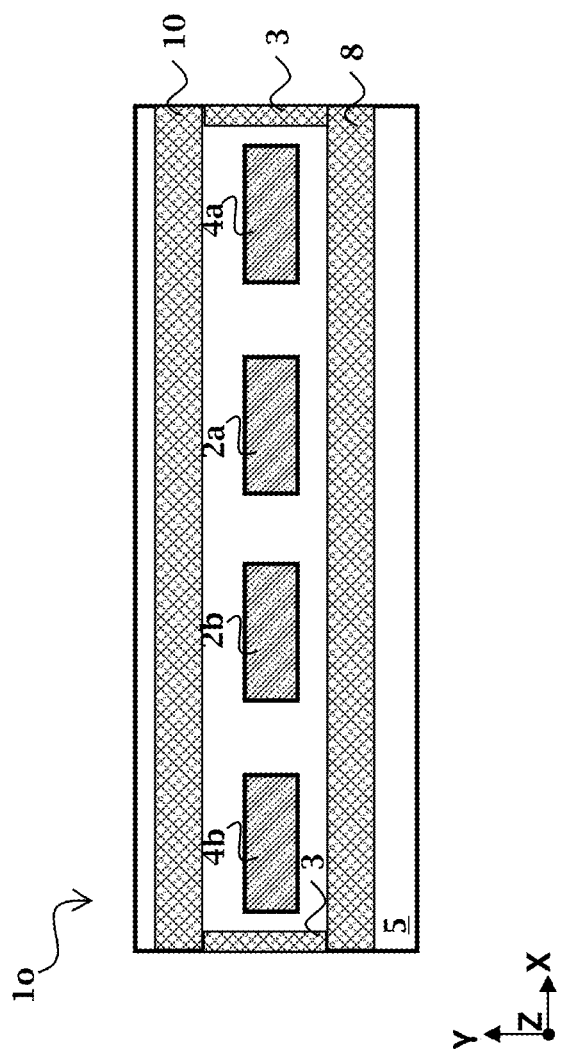
Figure 18:
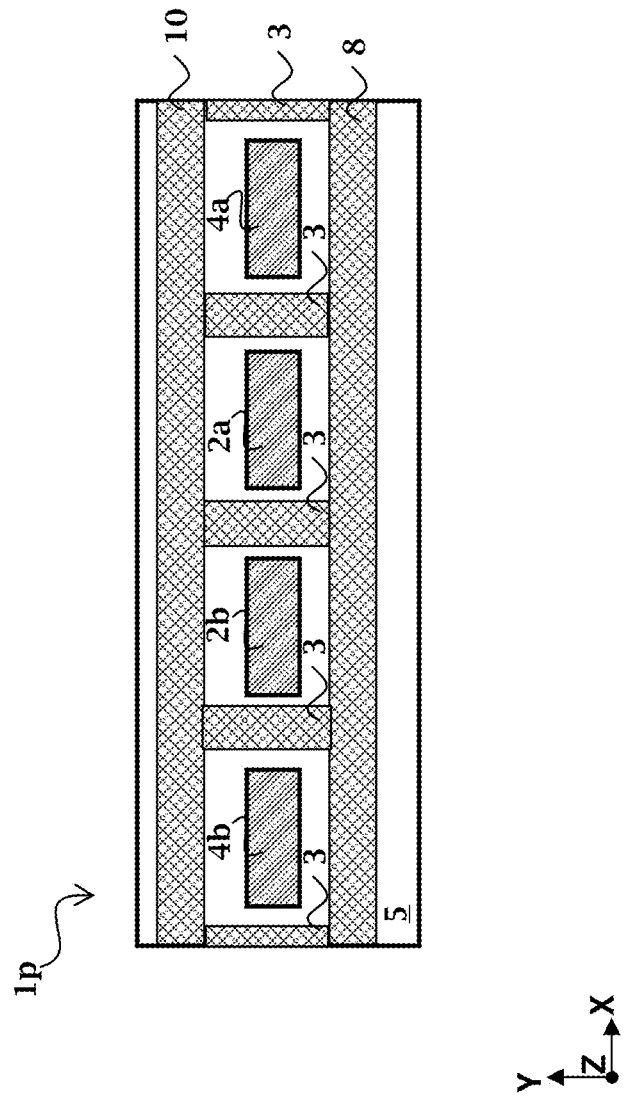
Figure 19:
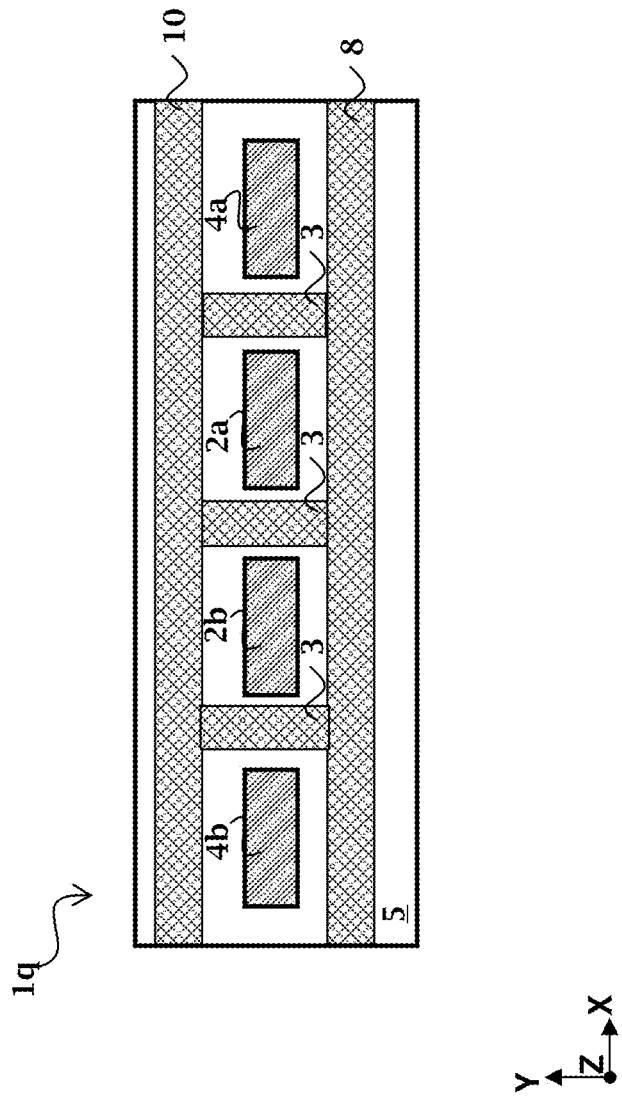

Referring to FIGS. 17 to 19, the ends of the dielectric regulating structures 8 and 10 are connected by two of the dielectric regulating structures 3, and therefore forming a squared ring shape surrounding the conductive lines in a plane 7. The square ring-shaped dielectric regulating structures includes the horizontally disposed dielectric regulating structures 8 and 10 connected by the vertically disposed dielectric regulating structures 3. The square ring-shaped dielectric regulating structure encloses and is perpendicular to the conductive lines as shown in FIG. 17. In some embodiments, as shown in FIG. 18, the dielectric regulating structures 3 are disposed within the square ring-shaped dielectric regulating structure. In one example, the dielectric regulating structures 3 are disposed at both sides of each of the conductive. In some embodiments, as shown in FIG. 19, the dielectric regulating structures 3 are disposed between the conductive lines only. The signal lines 2a and 2b are fully surrounded by the dielectric regulating structures 3, 8, and 10, while each of the ground lines 4a and 4b has at least one side that is not facing the dielectric regulating structures 3, 8, and 10. Such design increases the dielectric constant κ of the dielectric layer 5 in proximity of the signal lines 2a and 2b, while providing flexible design around the ground lines 4a and 4b.

Figure 20:
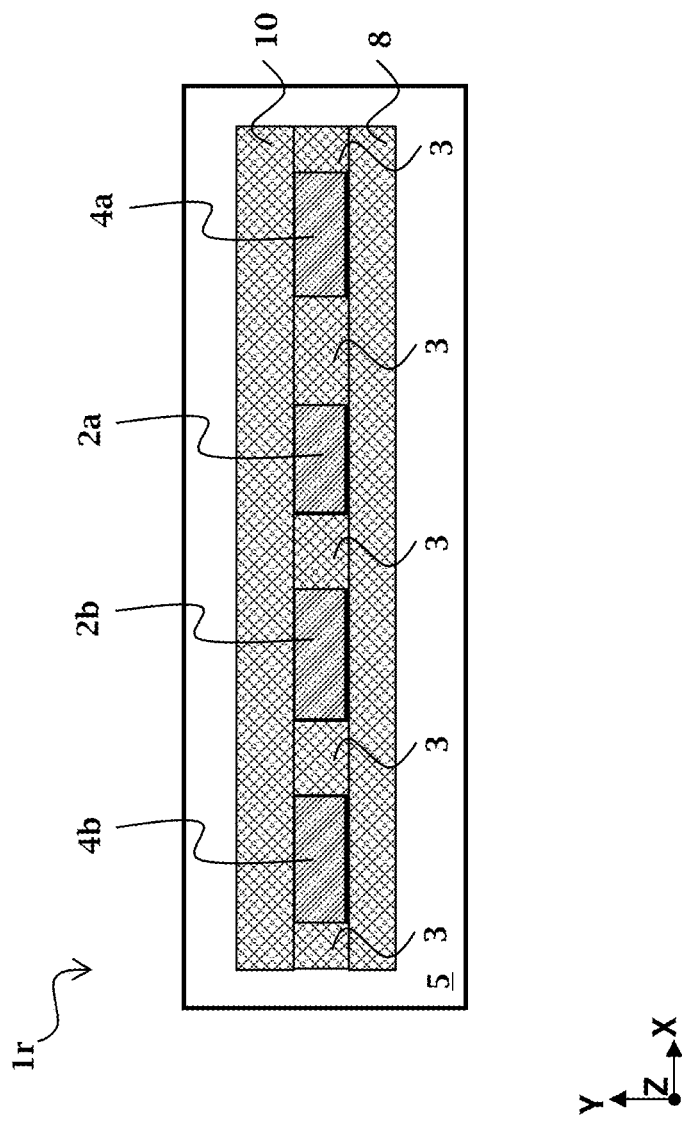
Figure 21:
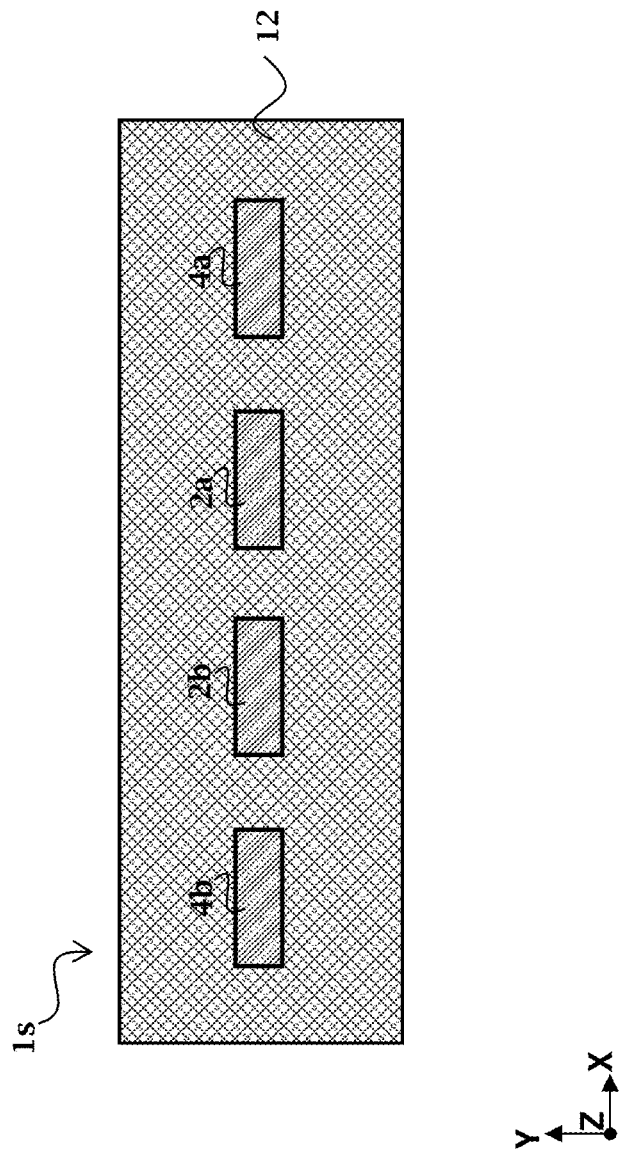

Referring to FIGS. 20 and 21, each of the dielectric regulating structures 3, 8, and 10 contacts the peripheries of the conductive lines. In some embodiments, the dielectric regulating structures 3, 8, and 10 contact four faces of the conductive lines. In other words, each of the conductive lines are disposed between and contacts the dielectric regulating structures 3, 8, and 10 in four faces. The dielectric regulating structures 3, 8, and 10 contacting the conductive lines affect the wavelength λ of the signal more effectively than these without direct contacting, thereby affect the length of the transmission line structure more effectively.

In the embodiments depicted in FIG. 21, the dielectric regulating structure 3, 8, and 10 extends the entire height of the dielectric layer 5 and extends beyond the leftmost edges and rightmost edges of the conductive lines. The extended dielectric regulating structures 3, 8, and 10 provide increased dielectric constant κ for regulating the wavelength of the signal traveling through the signal line 2a and 2b.

Figure 22:
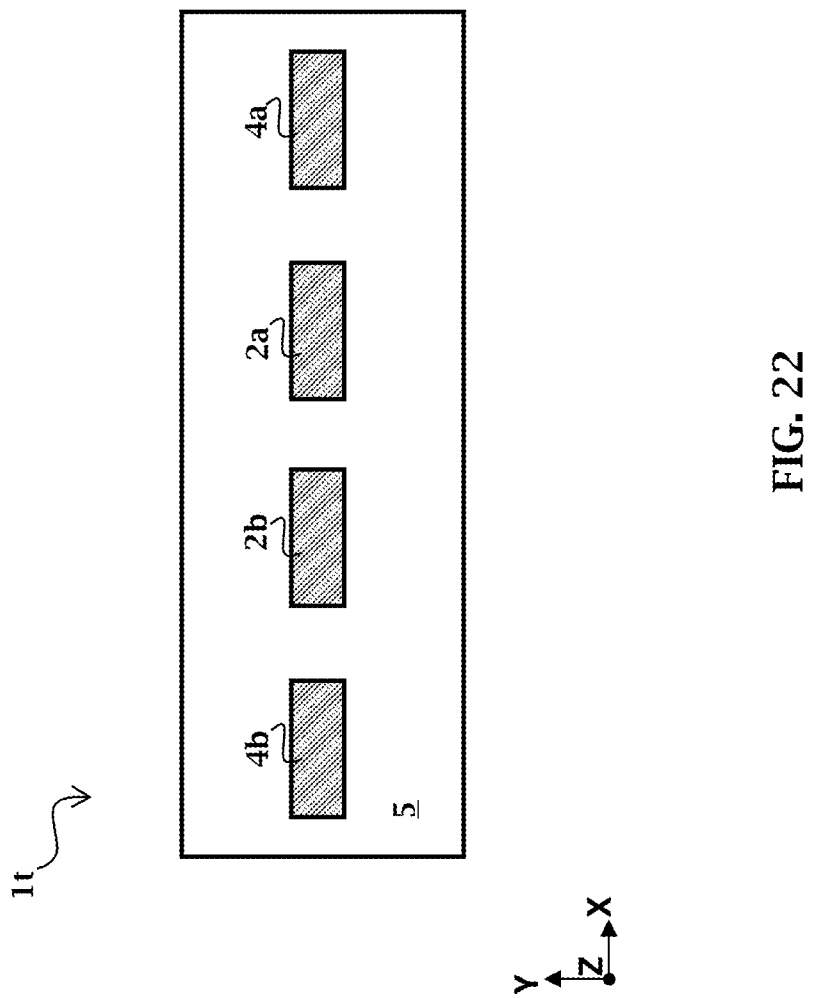

FIG. 22 is a cross-sectional view of a transmission line structure 1t along the line B-B' in FIGS. 3 and 10. The dielectric regulating structures 3, 8, and 10 are formed in intervals along the lengthwise direction (z direction) of the conductive lines. The line B-B' cuts through the portions of the transmission line structure that is free from the dielectric regulating structures.

Figure 23:
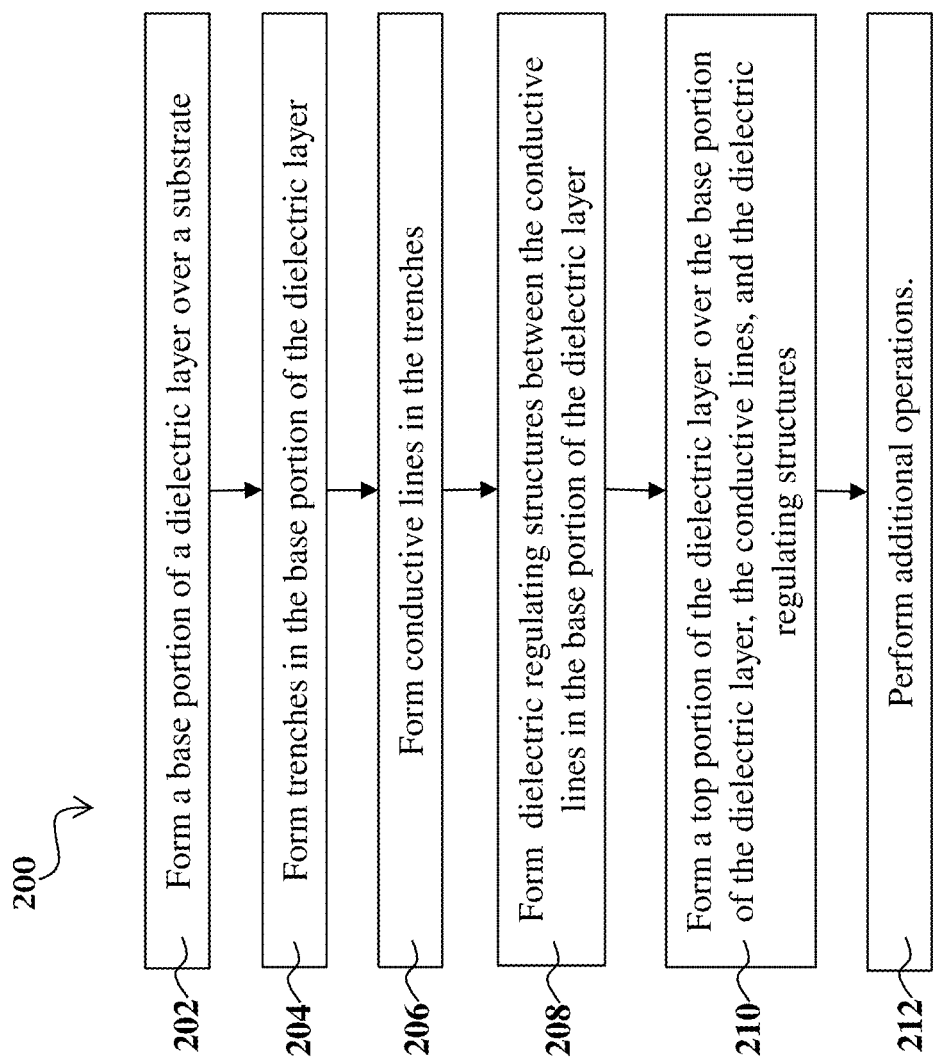
FIG. 23 illustrates a flow chart of a method for fabricating the transmission line structures in FIG. 1-22, according to various aspects of the present disclosure.

FIG. 23 illustrates a flow chart of a method 200 for forming the transmission line structure 1, according to an embodiment of the present disclosure. Additional operations can be provided before, during, and after method 200, and some of the operations described can be moved, replaced, or eliminated for additional embodiments of method 200.

Figure 24:
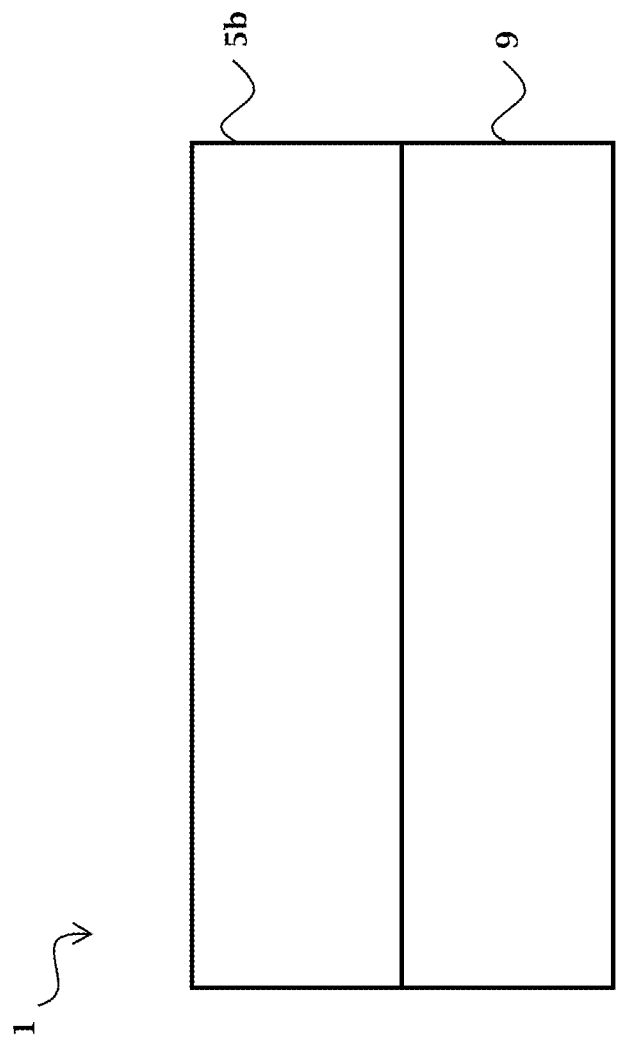
FIGS. 24-27 are cross-sectional views of a semiconductor structure during fabrication stages of the method of FIG. 23, according to various embodiments of the present disclosure.

At operation 202, referring to FIGS. 23 and 24, the method 200 forms a base portion 5b of the dielectric layer 5 over a substrate 9. In the present embodiment, the substrate 9 comprises an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In some embodiments, the substrate may be a semiconductor on insulator (SOI) such as a buried dielectric layer.

The substrate 9 may include multiple layers comprising the same or varying materials. The substrate 9 may further include various doping configurations depending on design requirements (e.g., p-type substrate regions or n-type substrate regions). It is understood that the substrate 9 may comprise partially or fully fabricated devices, structures, and or features known in the art, including but not limited to gate structures, source/drain regions, lightly doped regions, shallow trench isolations, transistors, diodes, vias, trenches, various contacts/vias and multilayer interconnect features (e.g., metal layers and interlayer dielectrics), other features, and/or combinations thereof.

The base portion 5b of the dielectric layer 5 may be formed over the substrate 9 by PECVD (plasma enhanced CVD), FCVD (flowable CVD), or other suitable methods. The compositions of the dielectric layer 5 (including the base portion 5b) are discussed in detail above in accordance with the FIG. 1.

Figure 25:
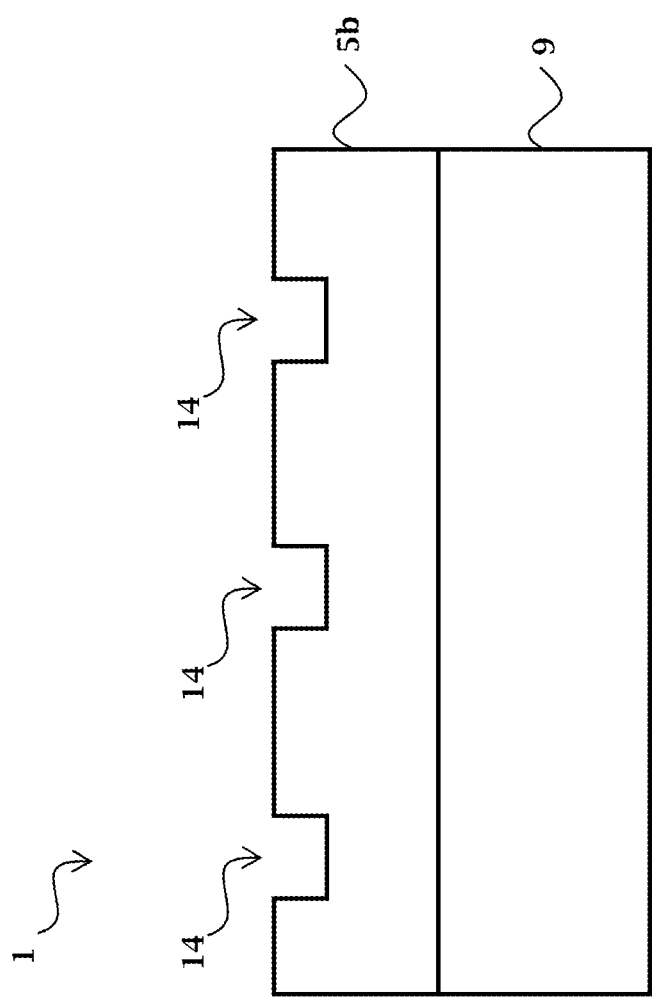

At operation 204, referring to FIGS. 23 and 25, the method 200 etches trenches 14 into the base portion 5b of the dielectric layer 5. The operation 204 may use photolithography to form an etch mask over the base portion 5b of the dielectric layer 5. The method 200 subsequently etches the base portion 5b of the dielectric layer 5 through the etch mask to form the trenches 14. The photolithography may use EUV lithography, DUV lithography, immersion lithography, or other lithography. The etching may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

Figure 26:
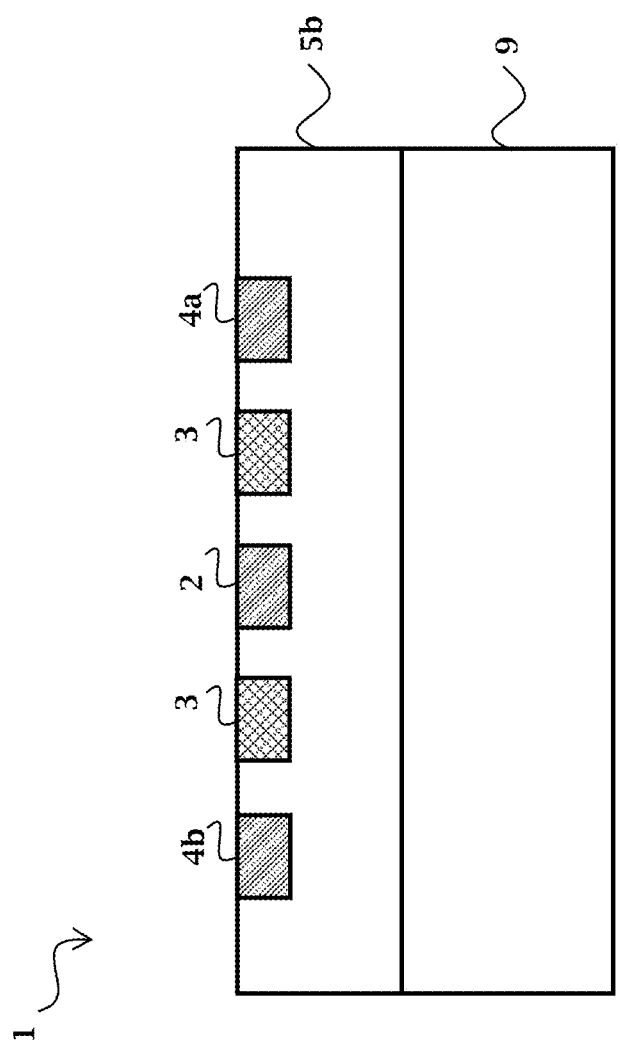

At operation 206, referring to FIGS. 23 and 26, the method 200 forms conductive lines 2, 4a, and 4b in the trenches 14. The conductive lines 2, 4a, and 4b may be formed by methods such as CVD, PVD, ALD, or other suitable processes. The compositions of the conductive lines 2, 4a, and 4b are discussed above in accordance with the FIG. 1.

At operation 208, still referring to FIGS. 23 and 26, the method 200 forms the dielectric regulating structures 3 in the base portion 5b of the dielectric layer 5 and between the conductive lines 2, 4a, and 4b. The compositions of the dielectric regulating structures 3 are discussed above in accordance with FIG. 1. The dielectric regulating structures 3 may be formed by deposition method or implantation method. The deposition method includes etching trenches (not shown) into the base portion 5b of the dielectric layer 5 using dry etching, wet etching, reactive ion etching (RIE), and/or other suitable processes. The deposition method then forms the dielectric regulating structures 3 in the trenches by CVD, PVD, ALD, PECVD, FCVD, other suitable processes, or combinations thereof. The implantation method of the dielectric regulating structures 3 includes implanting base portion 5*b* with fluorine, carbon, other suitable dopants, or combinations thereof. The dopants and doping concentrations of the dielectric regulating structures 3 are discussed above with respect to FIG. 1. The deposition method provides clear boundaries between the dielectric regulating structures 3 and the dielectric layer 5, and thereby providing more precise modeling of the length of the transmission line structure 1*u*. On the other hand, the implantation method provides simpler processing and/or areas and/or locations of the dielectric regulating structures 3 are more precisely controlled in the dielectric layer 5. It is noted that the forming of the dielectric regulating structures 3 is not limited to the deposition method and the implantation method.

Figure 27:
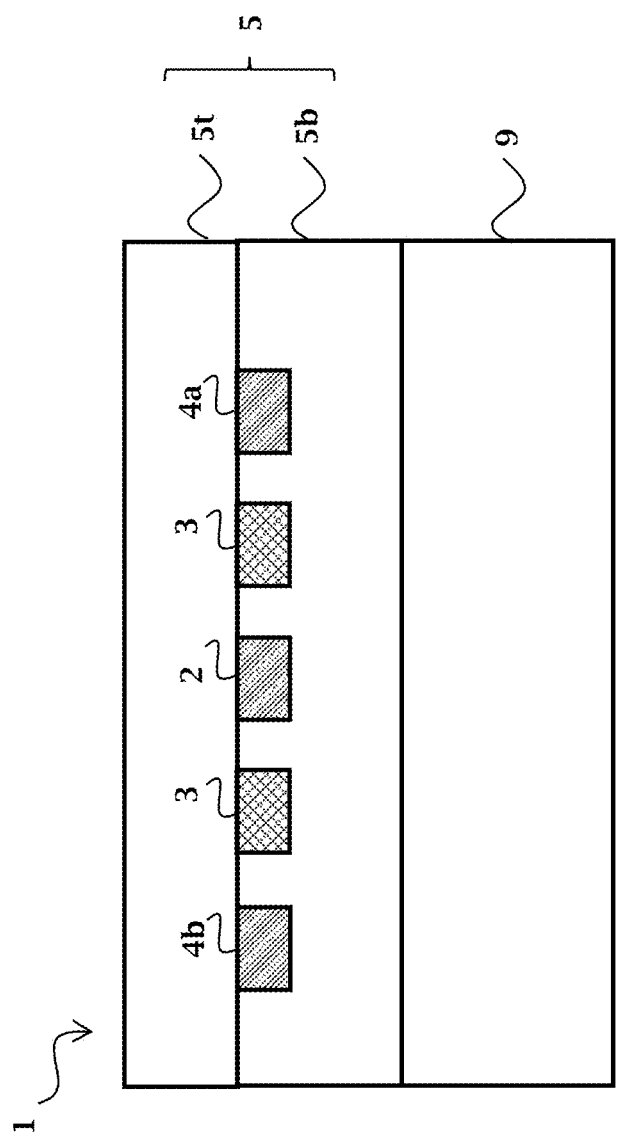

At operation 210, referring to FIGS. 23 and 27, the method 200 forms a top portion 5*t* of the dielectric layer 5 over the base portion of the dielectric layer 5, the conductive lines 2, 4*a*, and 4*b*, and the dielectric regulating structures 3. In the present embodiments, the top portion 5*t* and the base portion 5*b* of the dielectric layer 5 include the same material and are formed using the same method.

At operation 212, the method 200 performs additional operations. For example, the method 200 may form additional interconnect layers in the MLI. The additional interconnect layers may include transmission line structures and vias. The method 200 may further form a first passivation layer over the MLI, an aluminum pad over the first passivation layer, a second passivation layers over the first passivation layer and the aluminum pad. The method 200 may perform other suitable processes thereafter.

Although not intended to be limiting, embodiments of the present disclosure provide transmission line structures and the methods of forming the same. The transmission line structures include conductive lines and dielectric regulating structures embedded in a dielectric layer. The dielectric regulating structures have a dielectric constant κ greater than a dielectric constant κ of the dielectric layer. The dielectric regulating structures regulate the regional dielectric constant κ of the dielectric layer, such that the wavelength λ of the signal transmitted through the conductive lines are reduced. The reduced wavelength λ of the signal enables the reduction of the lengths of the conductive lines and thereby the footprint of the transmission line structure.

The dielectric regulating structures are disposed in parallel planes perpendicular and spaced apart along the lengthwise direction of the conductive lines. In some embodiments, the dielectric regulating structures in the same parallel plane have the same dielectric constant κ and/or the same dimensions. In some embodiments, the dielectric constant κ and/or the dimensions of the dielectric regulating structures in the parallel planes are disposed in periodical intervals along the lengthwise direction of the conductive lines. In some embodiments, the dielectric regulating structures include cuboids or rectangular prisms disposed in the parallel planes and between the conductive lines. In some embodiments, the dielectric regulating structures are ring-shaped in the parallel planes surrounding the conductive lines. The Embodiments of the present disclosure can be readily integrated into existing semiconductor manufacturing processes.

In one example aspect, the present disclosure is directed to a device that includes a dielectric layer and a transmission line structure disposed in the dielectric layer. The transmission line structure has a first metal line disposed between a second metal line and a third metal line. Dielectric islands are disposed in a first region of the dielectric layer between the first metal line and the second metal line and a second region of the dielectric layer between the first metal line and the third metal line. A dielectric constant of the dielectric islands is greater than a dielectric constant of the dielectric layer. In some embodiments, the dielectric islands are doped sections of the dielectric layer. In some embodiments, the dielectric islands disposed in the first region are aligned with the dielectric islands disposed in the second region along a direction perpendicular to a lengthwise direction of the first metal line.

In some embodiments, the dielectric islands are first dielectric islands, and the device further includes second dielectric islands disposed in the first region of the dielectric layer between the first metal line and the second metal line and the second region of the dielectric layer between the first metal line and the third metal line. The second dielectric islands have a dielectric constant that is greater than the dielectric constant of the first dielectric islands, and the second dielectric islands interleave the first dielectric islands in the first region and the second region. In some embodiments, the first dielectric islands and the second dielectric islands are doped sections of the dielectric layer, and the first dielectric islands and the second dielectric islands include a same dopant of different doping concentration. In some embodiments, each of the first dielectric islands has a first size, each of the second dielectric islands has a second size, and the first size is greater than the second size. In some embodiments, the first dielectric islands and the second dielectric islands disposed in the first region are symmetric to the first dielectric islands and the second dielectric islands disposed in the second region.

In another example aspect, the present disclosure is directed to a device that includes a dielectric layer disposed over a substrate. A transmission line structure is disposed in the dielectric layer, and the transmission line structure has a first transmission line disposed between a second transmission line and a third transmission line. A dielectric structure is disposed in planes perpendicular to a lengthwise direction of the transmission line structure. The planes are spaced apart from each other along the lengthwise direction of the transmission line structure, and the dielectric structure has a dielectric constant that is greater than a dielectric constant of the dielectric layer.

In some embodiments, the dielectric structure includes dielectric bars between the first transmission line and the second transmission line and between the first transmission line and the third transmission line. In some embodiments, first dielectric bars of the dielectric bars in first planes have a first dielectric constant, second dielectric bars of the dielectric bars in second planes have a second dielectric constant, and the second dielectric constant is different than the first dielectric constant. In some embodiments, first dielectric bars of the dielectric bars in first planes have a first width, second dielectric bars of the dielectric bars in second planes have a second width, the second width is different from the first width, and the first width and the second width are measured along the lengthwise direction of the transmission line structure. In some embodiments, the widths of the dielectric bars in the planes changes periodically along the lengthwise direction of the transmission line structure, and the widths are measured along the lengthwise direction of the transmission line structure.

In some embodiments, the dielectric structure includes a dielectric bar above the transmission line structure, and the dielectric structure spans along a widthwise direction of the transmission line structure from the first transmission line to the third transmission line. In some embodiments, the dielectric structure includes dielectric rings around the first transmission line, the second transmission line, and the third transmission line. In some embodiments, each of the dielectric rings contacts the first transmission line, the second transmission line, and the third transmission line.

In yet another example aspect, the present disclosure is directed to a method of forming a semiconductor device that includes forming a dielectric layer over a substrate and forming a transmission line structure in the dielectric layer. The transmission line structure extends lengthwise along a first direction. The method further includes forming a dielectric structure in the dielectric layer. The dielectric structure is disposed in a plurality of planes along a second direction that is different than the first direction, the planes are spaced apart from each other along the first direction, and the dielectric structure has a dielectric constant that is greater than a dielectric constant of the dielectric layer.

In some embodiments, the second direction is substantially perpendicular to the first direction. In some embodiments, the planes are substantially parallel to each other. In some embodiments, the transmission line structure includes a first transmission line disposed between a second transmission line and a third transmission line, and the dielectric structure includes dielectric bars disposed between the first transmission line and the second transmission line and between the first transmission line and the third transmission line. In some embodiments, first dielectric bars of the dielectric bars in first planes have a first dielectric constant, second dielectric bars of the dielectric bars in second planes have a second dielectric constant, and the second dielectric constant is different than the first dielectric constant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a dielectric layer;
a transmission line structure disposed in the dielectric layer, the transmission line structure having a first metal line disposed between a second metal line and a third metal line; and
dielectric islands disposed in a first region of the dielectric layer between the first metal line and the second metal line and a second region of the dielectric layer between the first metal line and the third metal line, wherein a dielectric constant of the dielectric islands is greater than a dielectric constant of the dielectric layer.

2. The device of claim 1 wherein the dielectric islands are doped sections of the dielectric layer.

3. The device of claim 1, wherein the dielectric islands disposed in the first region are aligned with the dielectric islands disposed in the second region along a direction perpendicular to a lengthwise direction of the first metal line.

4. The device of claim 1, wherein the dielectric islands are first dielectric islands, wherein the device further comprises second dielectric islands disposed in the first region of the dielectric layer between the first metal line and the second metal line and the second region of the dielectric layer between the first metal line and the third metal line, the second dielectric islands having a dielectric constant that is greater than the dielectric constant of the first dielectric islands, and wherein the second dielectric islands interleave the first dielectric islands in the first region and the second region.

5. The device of claim 4, wherein the first dielectric islands and the second dielectric islands are doped sections of the dielectric layer, wherein the first dielectric islands and the second dielectric islands include a same dopant of different doping concentration.

6. The device of claim 4, wherein each of the first dielectric islands has a first size and each of the second dielectric islands has a second size, and wherein the first size is greater than the second size.

7. The device of claim 4, wherein the first dielectric islands and the second dielectric islands disposed in the first region are symmetric to the first dielectric islands and the second dielectric islands disposed in the second region.

8. A device comprising:
a dielectric layer disposed over a substrate;
a transmission line structure disposed in the dielectric layer, the transmission line structure having a first transmission line disposed between a second transmission line and a third transmission line; and
a dielectric structure disposed in planes perpendicular to a lengthwise direction of the transmission line structure, wherein the planes are spaced apart from each other along the lengthwise direction of the transmission line structure, and wherein the dielectric structure has a dielectric constant that is greater than a dielectric constant of the dielectric layer.

9. The device of claim 8, wherein the dielectric structure includes dielectric bars between the first transmission line and the second transmission line and between the first transmission line and the third transmission line.

10. The device of claim 9, wherein first dielectric bars of the dielectric bars in first planes have a first dielectric constant, second dielectric bars of the dielectric bars in second planes have a second dielectric constant, and the second dielectric constant is different than the first dielectric constant.

11. The device of claim 9, wherein first dielectric bars of the dielectric bars in first planes have a first width, second dielectric bars of the dielectric bars in second planes have a second width, the second width is different from the first width, and the first width and the second width are measured along the lengthwise direction of the transmission line structure.

12. The device of claim 9, wherein first widths and second widths of the dielectric bars in the planes changes periodically along the lengthwise direction of the transmission line structure, wherein the first widths and the second widths are measured along the lengthwise direction of the transmission line structure.

13. The device of claim 8, wherein the dielectric structure includes a dielectric bar above the transmission line structure, wherein the dielectric structure spans along a widthwise direction of the transmission line structure from the first transmission line to the third transmission line.

14. The device of claim 8, wherein the dielectric structure includes dielectric rings around the first transmission line, the second transmission line, and the third transmission line.

15. The device of claim 14, wherein each of the dielectric rings contacts the first transmission line, the second transmission line, and the third transmission line.

16. A device comprising:

an electrically insulative layer;

a transmission line structure disposed in the electrically insulative layer, wherein the transmission line structure includes a first electrically conductive line, a second electrically conductive line, and a third electrically conductive line that extend lengthwise along a first direction, and further wherein the first electrically conductive line is disposed between the second electrically conductive line and the third electrically conductive line along a second direction, the second direction is different than the first direction, a first spacing is between the first electrically conductive line and the second electrically conductive line along the second direction, and a second spacing is between the first electrically conductive line and the third electrically conductive line along the second direction; and first doped regions disposed in the electrically insulative layer in the first spacing between the first electrically conductive line and the second electrically conductive line and second doped regions disposed in the electrically insulative layer in the second spacing between the first electrically conductive line and the third electrically conductive line, wherein the first doped regions have a first dielectric constant, the second doped regions have a second dielectric constant, and the first dielectric constant and the second dielectric constant are each greater than a third dielectric constant of the electrically insulative layer.

17. The device of claim 16, wherein:

the electrically insulative layer includes a first dopant concentration of a dopant; and the first doped regions and the second doped regions each include a second dopant concentration of the dopant that is greater than the first dopant concentration.

18. The device of claim 16, wherein:

the electrically insulative layer includes a first dopant; and the first doped regions and the second doped regions each include a second dopant that is different than the first dopant.

19. The device of claim 16, wherein:

the first doped regions include first doped sub-regions having a first dopant concentration and second doped sub-regions having a second dopant concentration that is different than the first dopant concentration; and the second doped regions include third doped sub-regions having a third dopant concentration and fourth doped sub-regions having a fourth dopant concentration that is different than the third dopant concentration.

20. The device of claim 16, wherein:

each of the first electrically conductive line, the second electrically conductive line, and the third electrically conductive line has a first height along a third direction that is different than the second direction and the first direction; and each of the first doped regions and the second doped regions have a second height along the third direction, wherein the second height is substantially the same as the first height.

\* \* \* \* \*